US011557655B2

(12) United States Patent
Fulford et al.

(10) Patent No.: US 11,557,655 B2
(45) Date of Patent: Jan. 17, 2023

(54) DEVICE AND METHOD OF FORMING WITH THREE-DIMENSIONAL MEMORY AND THREE-DIMENSIONAL LOGIC

(71) Applicant: Tokyo Electron Limited, Tokyo (JP)

(72) Inventors: H. Jim Fulford, Marianna, FL (US); Mark Gardner, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 200 days.

(21) Appl. No.: 16/827,101

(22) Filed: Mar. 23, 2020

(65) Prior Publication Data

US 2021/0111258 A1    Apr. 15, 2021

Related U.S. Application Data

(60) Provisional application No. 62/914,134, filed on Oct. 11, 2019.

(51) Int. Cl.
*H01L 27/11556* (2017.01)
*H01L 27/11582* (2017.01)
*H01L 29/78* (2006.01)
*H01L 29/417* (2006.01)
*H01L 29/66* (2006.01)

(52) U.S. Cl.
CPC .. *H01L 29/41791* (2013.01); *H01L 27/11556* (2013.01); *H01L 27/11582* (2013.01); *H01L 29/66795* (2013.01); *H01L 29/785* (2013.01); *H01L 2029/7858* (2013.01)

(58) Field of Classification Search
CPC ......... H01L 29/41791; H01L 29/66795; H01L 2029/7858
See application file for complete search history.

(56) References Cited

U.S. PATENT DOCUMENTS 8,742,492 B2   6/2014   Chuang et al.
9,123,745 B2   9/2015   Chuang et al.
(Continued)

FOREIGN PATENT DOCUMENTS

KR   10-2014-0122042 A   10/2014

OTHER PUBLICATIONS

International Search Report and Written Opinion dated Nov. 24, 2020 in PCT/US2020/046649, 8 pages.

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

In a method for forming a semiconductor device, a layer of logic devices is formed on a substrate. The layer of logic devices includes a stack of gate-all-around field-effect transistors (GAA-FETs) positioned over the substrate, where the stack of GAA-FETs includes a first layer of GAA-FETs stacked over a second layer of GAA-FETs. A first wiring layer is formed over the layer of logic devices, where the first wiring layer includes one or more metal routing levels. A memory stack is formed over the first wiring layer. The memory stack includes wordline layers and insulating layers that alternatingly arranged over the first wiring layer. A three-dimensional (3D) NAND memory device is formed in the memory stack. The 3D NAND memory device includes a channel structure that extends into the memory stack and further is coupled to the wordline layers of the memory stack.

12 Claims, 15 Drawing Sheets

(56) References Cited

U.S. PATENT DOCUMENTS

| | | |
|---|---|---|
| 9,214,225 B2 | 12/2015 | Park |
| 9,269,426 B1 | 2/2016 | Park |
| 9,293,510 B1 | 3/2016 | Park |
| 9,443,910 B1* | 9/2016 | Fujiwara ................ H01L 45/08 |
| 10,211,307 B2 | 2/2019 | Ching et al. |
| 10,332,881 B1 | 6/2019 | Badaroglu et al. |
| 10,714,391 B2 | 7/2020 | Smith et al. |
| 2013/0203227 A1* | 8/2013 | Huo .................... H01L 27/0688 |
| | | 438/238 |
| 2014/0042524 A1 | 2/2014 | Chuang et al. |
| 2014/0301128 A1 | 10/2014 | Park |
| 2015/0017775 A1 | 1/2015 | Chuang et al. |
| 2016/0064072 A1 | 3/2016 | Park |
| 2016/0064454 A1 | 3/2016 | Park |
| 2019/0027570 A1 | 1/2019 | Ching et al. |
| 2019/0115438 A1 | 4/2019 | Ching et al. |
| 2019/0172751 A1 | 6/2019 | Smith et al. |
| 2020/0052084 A1 | 2/2020 | Ching et al. |
| 2020/0303256 A1 | 9/2020 | Smith et al. |

\* cited by examiner

DEVICE AND METHOD OF FORMING WITH THREE-DIMENSIONAL MEMORY AND THREE-DIMENSIONAL LOGIC

FIELD OF THE INVENTION

This disclosure relates to integrated circuits and the fabrication of microelectronic devices. Specially, the present disclosure relates to forming a semiconductor device that has three-dimensional memory structures and three-dimensional logic transistors over a substrate.

BACKGROUND

In the manufacture of a semiconductor device (especially on the microscopic scale), various fabrication processes are executed such as film-forming depositions, etch mask creation, patterning, photoresist development, material etching and removal, as well as doping treatments. These processes are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other. Fabrication of 3D semiconductor devices poses many new and unique challenges associated with scaling, post-fabrication processing, as well as other aspects of the 3D fabrication process.

SUMMARY 3D integration is seen as a viable option to continue semiconductor scaling in spite of inevitable saturation in critical dimension scaling. As the contacted gate pitch reaches its scaling limit due to manufacturing variability and electrostatic device limitations, two-dimensional transistor density scaling stops. Even experimental new transistor designs, such as vertical channel gate-all-around transistors, that may be able to one day overcome these contacted gate pitch scaling limits, do not promise to get semiconductor scaling back on track because resistance, capacitance, and reliability concerns limit wire pitch scaling, thereby limiting the density with which transistors can be wired into circuits.

3D integration, i.e., the vertical stacking of multiple devices, aims to overcome these scaling limitations by increasing transistor density in volume rather than area. This idea has been successfully demonstrated and implemented by the flash memory industry with the adoption of 3D NAND. Mainstream CMOS VLSI scaling, as used for example in CPU or GPU products, is exploring adoption of 3D integration as a primary means of moving the semiconductor roadmap forward, and thus desires enabling technologies.

Techniques herein provide a circuit and method of fabrication that includes 3D logic adjacent to 3D NAND memory on a same die or chip. Such chips can also include high-performance 3D SRAM. Techniques include different methods of realizing stacked 3D memory and 3D logic. One stacking method includes using an oxide/metal stack using such metals as W, TaN, and TiN. Another stacking method is an oxide/doped poly silicon stack, with doping including N+ and P+ doping. Embodiments herein enable 3D logic flow to be compatible with 3D NAND flow such that the thermal budget and materials used can withstand temperature constraints to achieve both high performance 3D NAND and high performance 3D logic.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a method for forming a semiconductor device is provided. In the disclosed method, a layer of logic devices can be formed on a substrate. The layer of logic devices can include a stack of gate-all-around field-effect transistors (GAA-FETs) positioned over the substrate, where the stack of GAA-FETs includes a first layer of GAA-FETs stacked over a second layer of GAA-FETs. A first wiring layer can be formed over the layer of logic devices, where the first wiring layer includes one or more metal routing levels. A memory stack can be formed over the first wiring layer. The memory stack can include wordline layers and insulating layers that alternatingly arranged over the first wiring layer. A three-dimensional (3D) NAND memory device can then be formed in the memory stack. The 3D NAND memory device includes a channel structure that extends into the memory stack and further coupled to the wordline layers of the memory stack.

In some embodiments, a second wiring layer can be formed over the 3D NAND memory device, where the second wiring layer can include one or more metal routing levels.

In order to form the 3D NAND memory device, a channel opening can be formed to extend into a first portion of the memory stack. The channel opening has sidewalls and a bottom that expose one of the insulating layers in a second portion of the memory stack, where the first portion of the memory stack is positioned on the second portion of the memory stack. Portions of the wordline layers in the first portion of the memory stack can be removed so that the wordline layers in the first portion of the memory stack are recessed from the sidewalls of the channel opening, and gaps are formed between the insulating layers in the first portion of the memory stack and further positioned along the sidewalls of the channel opening.

Further, blocking layers of the channel structure can be formed in the gaps, where the blocking layers can be disposed along sidewalls of the wordline layers in the first portion of the memory stack. Charge storage layers of the channel structure can be formed along sidewalls of the blocking layers in the gaps so that the blocking layers are disposed between the wordline layers and the charge storage layers. A tunneling layer of the channel structure can then be formed in the channel opening. The tunneling layer can be positioned along the sidewalls and over the bottom of the channel opening. A channel layer of the channel structure can be formed over the tunneling layer in the channel opening, and a channel contact of the channel structure can be formed over the channel layer in the channel opening, where the channel contact can be surrounded by the channel layer.

In some embodiments, in order to form the charge storage layers of the channel structure, a polycrystalline silicon layer can be formed along the sidewalls and over the bottom of the channel opening. The polycrystalline silicon layer can further extend into the gaps to fill the gaps. A first portion of the polycrystalline silicon layer can then be removed along the sidewalls and the over the bottom of the channel opening so that a second portion of the polycrystalline silicon layer remains in the gaps. The second portion of the polycrystalline silicon layer that remains in the gaps becomes the charge storage layers of the channel structure.

In some embodiments, a top channel contact can be formed over an uppermost insulating layer of the insulating layers, and the top channel contact can be arranged to surround the channel contact. In addition, wordline contacts can be formed in the wordline layers and the insulating layers, where the wordline contacts extend through the wordline layers and the insulating layers so as to be coupled to the first wiring layer and the second wiring layer.

In some embodiments, the insulating layers can be made of SiO. The wordline layers can be made of polycrystalline silicon. In some embodiments, the wordline layers can be made of a metal that includes at least one of tungsten (W), TaN, or TiN.

In order to form the layer of logic devices on the substrate, the second layer of GAA-FETs can be formed over the substrate. The second layer of GAA-FETs can include second GAA-FETs. Source/drain regions and channel regions of the second GAA-FETs can be disposed alternatingly and arranged along a top surface of the substrate. Further, the first layer of GAA-FETs can be formed over the second layer of GAA-FETs. The first layer of GAA-FETs can have first GAA-FETs, where source/drain regions and channel regions of the first GAA-FETs can be disposed alternatingly and positioned along the top surface of the substrate.

In another embodiment, in order to form the 3D NAND memory device, an etching process can be performed to form staircase regions and an array region in the memory stack, where the array region can be positioned between the staircase regions. A channel structure can be formed in the array region of the memory stack. The channel structure can extend into the memory stack along a vertical direction of the substrate that is perpendicular to the substrate. Wordline contacts can subsequently be formed in the staircase regions. The wordline contacts can land on the wordline layers in the memory stack, and further extend along the vertical direction of the substrate.

In order to form the channel structure, a channel opening can be formed to extend into a first portion of the memory stack along the vertical direction of the substrate. The channel opening has sidewalls and a bottom that uncovers one of the insulating layers in a second portion of the memory stack, where the first portion of the memory stack is positioned on the second portion of the memory stack. A blocking layer can be formed along the sidewalls and positioned over the bottom of the channel opening. A charge storage layer can be formed over the blocking layer in the channel opening. A tunneling layer can then be formed over the charge storage layer in the channel opening. A channel layer can be formed over the tunneling layer in the channel opening. An etching process can be subsequently performed to remove a portion of the blocking layer, a portion of the charge storage layer, a portion of the tunneling layer and a portion of the channel layer that are positioned over the bottom of the channel opening. A channel contact can then be formed in the channel opening, where the channel contact can be surrounded by the channel layer and arranged over the bottom of the channel opening.

According to another aspect of the disclosure, a semiconductor device is provided. The semiconductor device can have a layer of logic devices arranged on a substrate. The layer of logic devices includes a stack of gate-all-around field-effect transistors (GAA-FETs) positioned over the substrate. The stack of GAA-FETs includes a first layer of GAA-FETs stacked over a second layer of GAA-FETs. The semiconductor device can have a first wiring layer positioned over the layer of logic devices, where the first wiring layer includes one or more metal routing levels. A three-dimensional (3D) NAND memory device can be disposed over the first wiring layer. The 3D NAND memory device can be formed in a memory stack, where the memory stack includes wordline layers and insulating layers that are arranged alternatingly over the first wiring layer. The 3D NAND memory device includes at least one channel structure that extends into the wordline layers and the insulating layers along a vertical direction that is perpendicular to the substrate. In addition, the semiconductor device can further have a second wiring layer formed over the 3D NAND memory device, where the second wiring layer includes one or more metal routing levels.

In some embodiments, the at least one channel structure can have blocking layers positioned along sidewalls of the wordline layers and disposed between the insulating layers. The blocking layers further can be arranged along the vertical direction. The at least one channel structure can have charge storage layers positioned along sidewalls of the blocking layers and disposed between the insulating layers. The charge storage layers can further be disposed along the vertical direction, and sidewalls of the charge storage layers and sidewalls of the insulating layers can be co-planar. The at least one channel structure can have a tunneling layer formed along the sidewalls of the insulating layers and the sidewalls of the charge storage layers. The tunneling layer further can be positioned on one of the insulating layers. The at least one channel structure can have a channel layer formed over the tunneling layer, where the channel layer is arranged along sidewalls of the tunneling layer and positioned on a bottom of the tunneling layer. In the channel structure, a channel contact can be disposed over the channel layer, where the channel contact further is surrounded by the channel layer.

In some embodiments, the at least one channel structure can have a top channel contact that is positioned over an uppermost insulating layer of the insulating layers, and disposed to surround the channel contact.

In some embodiments, the 3D NAND memory device can have wordline contacts formed in the wordline layers and the insulating layers. The wordline contacts can extend through the wordline layers and the insulating layers so as to be coupled to the first wiring layer and the second wiring layer.

In some embodiments, the insulating layers can include SiO, and the wordline layers can include at least one of polycrystalline Si, tungsten (W), TaN or TiN.

In some embodiments, the first layer of GAA-FETs can include first GAA-FETs. Source/drain regions and channel regions of the first GAA-FETs can be disposed alternatingly and arranged along the top surface of the substrate. The second layer of GAA-FETs can include second GAA-FETs. Source/drain regions and channel regions of the second GAA-FETs can be disposed alternatingly and arranged along the top surface of the substrate.

In another embodiment, the 3D NAND memory device can have staircase regions and an array region in the memory stack. The array region can be positioned between the staircase regions. A channel structure can be formed in the array region of the memory stack. The channel structure can extend into the memory stack along a vertical direction of the substrate that is perpendicular to the substrate. Wordline contacts can further be formed in the staircase regions. The wordline contacts can land on the wordline layers of the memory stack, and further extend along the vertical direction of the substrate.

The channel structure can have a blocking layer extending into a first portion of the memory stack. The blocking layer can be in direct contact with the wordline layers and the insulating layers of the first portion of the memory stack. The blocking layer can further be positioned on a second portion of the memory stack, and the first portion of the memory stack is positioned on the second portion of the memory stack. The channel structure can have a charge storage layer disposed along sidewalls of the blocking layer, where the charge storage layer can also be positioned on the second portion of the memory stack. The channel structure can have a tunneling layer disposed along sidewalls of the charge storage layer. The tunneling layer can further be positioned on the second portion of the memory stack. The channel structure can have a channel layer formed along sidewalls of the tunneling layer, where the channel layer is positioned on the second portion of the memory stack. The channel structure can include a channel contact formed along sidewalls of the channel layer. The channel contact can be surrounded by the channel layer and positioned on the second portion of the memory stack.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
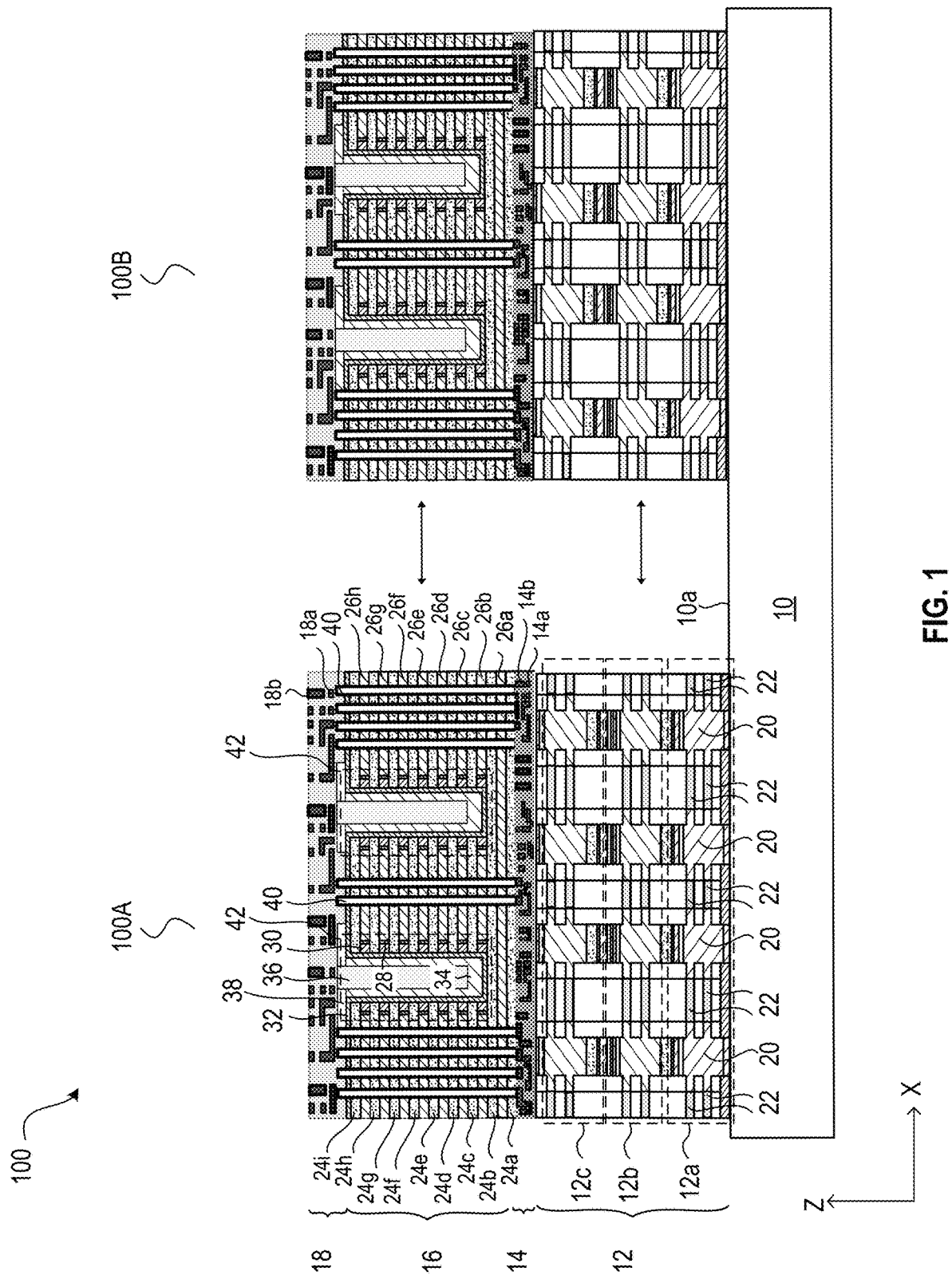
FIG. 1 is a cross-sectional view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques herein enable stacking 3D NAND memory cells on 3D logic transistors. Emerging embodiments of 3D logic transistors, such as CFET (complementary field-effect transistor) or other gate-all-around nano-channel (nanowire or nano-sheet) transistors, can be formed from a preferred stack of alternating layers. A wiring layer can be formed on top of the 3D logic transistors. Then the 3D NAND (vertical-NAND) memory cells are formed on a top of the wiring layer. The 3D NAND memory cells can be formed from alternating layers of oxide and doped polysilicon, or from alternating layers of oxide and metal. The 3D NAND memory cells are then electrically connected to the underlying 3D logic transistors through the wiring layer.

FIG. 1 is an exemplary embodiment of a semiconductor device 100 that has 3D NAND memory cells stacked on 3D logic transistors. As shown in FIG. 1, the semiconductor device 100 can have a plurality of regions that have 3D NAND memory cells stacked on 3D logic transistors. For example, two regions 100A and 100B of the semiconductor device 100 are illustrated in FIG. 1. In some embodiments, the region 100A can have a similar configuration to the region 100B. In some embodiments, the region 100A can be coupled to the region 100B, and thus data is transmitted between the region 100A and the region 100B. For simplicity and clarity, the features of the portions of the semiconductor device 100 can be illustrated based on the region 100A in FIG. 1.

As shown in FIG. 1, the region 100A can be formed on a substrate 10. In some embodiments, the substrate 10 may be a semiconductor substrate such as Si substrate. The substrate 10 may also include other semiconductors such as germanium (Ge), silicon carbide (SiC), silicon germanium (SiGe), or diamond. The region 100A can have a layer of logic devices 12 arranged on the substrate 10, and the layer of logic devices 12 can include a stack of gate-all-around field-effect transistors (GAA-FETs) positioned over the substrate 10. The stack of GAA-FETs can include one or more layers of GAA-FETs that are stacked on the substrate 10. For example, three layers of GAA-FETs 12a-12c can be included in the layer of logic devices 12, where the layer of GAA-FETs 12b is stacked over the layer of GAA-FETs 12a, and the layer of GAA-FETs 12c is positioned over the layer of GAA-FETs 12b.

In an embodiment of FIG. 1, each layer of GAA-FETs can include respective GAA-FETs. Source/drain regions and channel regions of the respective layer of GAA-FETs can be disposed alternatingly and arranged along a top surface 10a of the substrate 10. For example, the layer of GAA-FETs 12a can have five GAA-FETs, and source/drain regions 22 and channel regions 20 of the five GAA-FETs are disposed alternatingly and arranged along the top surface 10a of the substrate 10.

The region 100A can have a first wiring layer 14 positioned over the layer of logic devices 12. The first wiring layer including one or more metal routing levels. For example, two metal routing levels 14a-14b are illustrated in FIG. 1. In some embodiments, interconnect structures (e.g., Vias) can be formed between the one or more metal routing levels to connect the one or more metal routing levels from one another.

The region 100A can have a three-dimensional (3D) NAND memory device 16 disposed over the first wiring layer 14. The 3D NAND memory device 16 can be formed in a memory stack. The memory stack includes wordline layers and insulating layers that are arranged alternatingly over the first wiring layer 14. For example, nine insulating layers 24a-24i and eight wordline layers 26a-26h can be included in FIG. 1. The wordline layers 26 are disposed between the insulating layers 24 and spaced apart from one another by the insulating layers 24. The 3D NAND memory device 16 can include a plurality of channel structures that extend into the wordline layers 26 and the insulating layers 24 along a vertical direction (e.g., Z direction) that is perpendicular to the substrate 10. In the region 100A, a second wiring layer 18 can be formed over the 3D NAND memory device 16, where the second wiring layer 18 can include one or more metal routing levels, such as metal routing levels 18a-18b.

Still referring to FIG. 1, two channel structures 42 can be illustrated in the 3D NAND memory device 16. The channel structure 42 can have blocking layers 28 and charge storage layers 30 that are disposed along the vertical direction. The blocking layers 28 and the charge storage layers 30 can be aligned with the wordline layers 26 along the top surface 10a of the substrate 10, and further positioned between the insulating layers 24. The blocking layers 28 can be arranged between the wordline layers 26 and the charge storage layers 30. In addition, sidewalls of the charge storage layers 30 and sidewalls of the insulating layers 24 can be co-planar.

The channel structure 42 can have a tunneling layer 32 formed along the sidewalls of the insulating layers 24 and the sidewalls of the charge storage layers 30. The tunneling layer 32 further can be positioned on one of the insulating layers, such as an insulating layer 24b. The channel structure 42 can also have a channel layer 34 formed over the tunneling layer 32. As shown in FIG. 1, the channel layer 34 can be arranged along sidewalls of the tunneling layer 32 and further positioned on a bottom of the tunneling layer 32. A channel contact 36 can be disposed over the channel layer 34, and the channel contact 36 further can be surrounded by the channel layer 34. In some embodiments, a top channel contact 38 can be positioned over an uppermost insulating layer of the insulating layers, such as the insulating layer 24i, and the top channel contact 38 can be disposed to surround the channel contact 36. In some embodiments, the top channel contact 38 can be heavily doped and coupled to the channel layer 34.

In some embodiments, the 3D NAND memory device 16 can further include a plurality of wordline contacts 40. The wordline contacts 40 can be formed in the wordline layers 26 and the insulating layers 24. The wordline contacts 40 can extend through the wordline layers 26 and the insulating layers 24 so as to be coupled to the first wiring layer 14 and the second wiring layer 18. Accordingly, the 3D NAND memory device 16 can be coupled to the layer of logic devices 12 through the first wiring layer 14. In some embodiments, the second wiring layer 18 can function as bit lines to receive input signals that operate the 3D NAND memory device. In some embodiments, the second wiring layer 18 can be coupled to other components of the semiconductor device 100. For example, the second wiring layer 18 can be coupled to the region 100B of the semiconductor device 100 to transmit data between the region 100A and the region 100B.

In a 3D NAND device, channel structures and wordlines are coupled to each other to form vertical NAND memory cell strings. Each of the vertical NAND memory cell strings can have a source contact, a select gate source (SGS) transistor, a plurality of memory cells (MCs), a select gate drain (SGD) transistor, and a bitline that are disposed sequentially and in series over a substrate along a vertical direction (or Z direction) of the substrate. Each of the vertical NAND memory cell strings can be formed of a channel structure and the wordlines (WLs) that surrounds the channel structure. As shown in FIG. 1, two vertical NAND memory cell strings (or strings) are included in the region 100A that are formed of the two channel structures 42 and the wordline layers 26. Each of the strings can have a channel contact 36, a bottom wordline layer 26b that functions as a gate electrode of a select gate source (SGS) transistor, a plurality of wordlines layers 26c-26g positioned over the bottom wordline layer 26b and function as gate electrodes of control gates (CG) of the memory cells, a top wordline 26h that functions as a gate electrode of a select gate drain (SGD) transistor, and a top channel contact 38. The memory cells are formed of the channel structure 42 and the wordline layers 26c-26g. The SGS transistor is formed of the bottom wordline layer 26b and the channel structure 42. The SGD transistor formed of the top wordline 26h and the channel structure 42.

In some embodiments, the insulating layers 24 can be made of SiO. The wordline layers 26 can be made of polycrystalline Si. In some embodiments, the wordline layers 26 can further be doped with a dopant, such as a N-type dopant. In some embodiments, the wordline layers 26 can be made of a metal that includes at least one of tungsten (W), TaN, or TiN. In some embodiments, the blocking layers 28 can be made of SiO, the charge storage layers 30 can be made of polycrystalline Si, the tunneling layer 32 can be made of SiO, and the channel layer 34 can be made of polycrystalline Si. The channel contact 36 can be made of metal, such as W, Co, Ru, Al, Cu or other suitable metallic materials. The top channel contact 38 can be made of polycrystalline Si with an N+ doping.

It should be noted that FIG. 1 is merely an example. The 3D NAND memory device 16 can include any number of wordline layers, any number of channel structures according to the storage capacity of the 3D NAND memory device.

FIGS. 2-17 are cross-sectional views of first various exemplary intermediate steps of manufacturing the semiconductor device 100. Embodiments can now be described with reference to the drawings. Description of the manufacturing steps can focus on the 3D NAND memory device with a memory stack of oxide/doped polysilicon, but processing is similar for the NAND memory device with a memory stack of oxide/metal.

Figure 2:
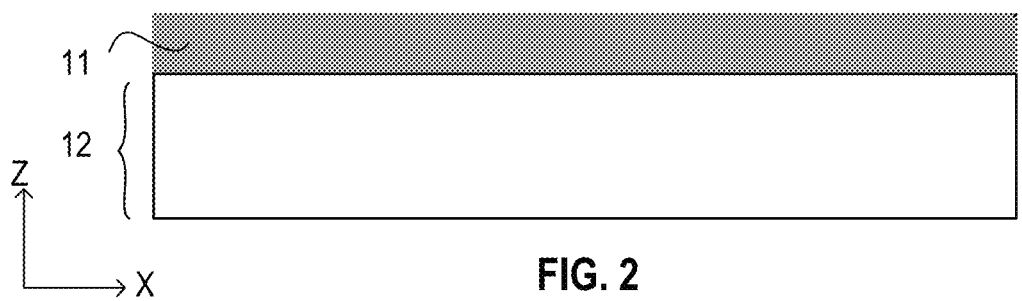
FIGS. 2-17 are cross-sectional views of first various exemplary intermediate steps of manufacturing a semiconductor device, in accordance with some embodiments.

In FIG. 2, a layer of logic devices (e.g., the layer of logic devices 12) can be formed on a substrate (e.g., the substrate 10, not shown in FIG. 2) firstly. The layer of logic devices 12 can have similar configurations to the layer of logic devices 12 in FIG. 1. The layer of logic devices 12 can include a vertical stack of gate-all-around nano-channel field-effect transistors in which the vertical stack includes at least one field-effect transistor stacked over another field-effect transistor. The nano-channel refers to either nanowire channels or nano-sheet (rectangular) channels. Both of the nanowire channels and the nano-sheet channels can have a gate on all sides/surfaces of a cross section. The layer of logic devices 12 provides a three-dimensional logic structure that includes logic cells in which two or more transistors are stacked vertically (e.g., along Z direction). In the present disclosure, any 3D process flow can be used, such as CFET (complementary field-effect transistor) in which an N-channel FET can be stacked on a P-channel FET, or the reverse. Forming such 3D logic devices can include forming an epitaxial layer stack, cutting the stack into fin structures, cutting fin structures into segments, removing and/or replacing intermediate stack material to leave channel material, forming source/drain on ends of channel materials within in the fin structure stack, forming gates all around channels, and wiring the transistors. Each transistor can include one or more gate-all-around channels, and at least two gate-all-around transistors are formed in a vertical stack along a Z direction. Still referring to FIG. 2, when the layer of logic devices 12 is formed, a dielectric layer 11 can be deposited over the layer of logic devices 12.

Figure 3:
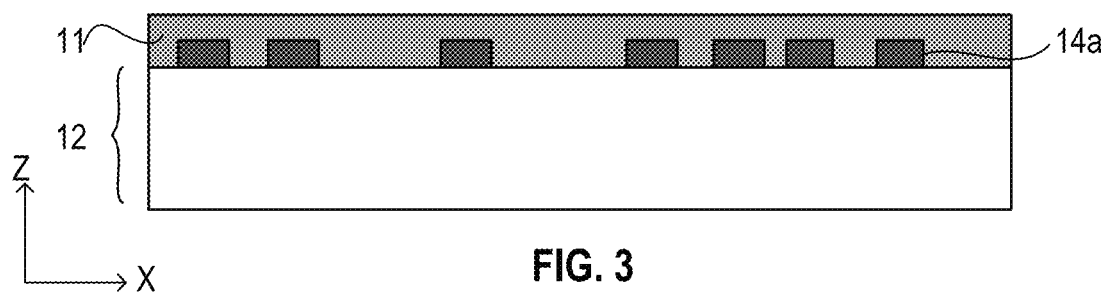

In FIG. 3, a metal routing level 14a can be formed in the dielectric layer 11. FIG. 3 shows a cross section view of the metal routing level 14a that is formed through a manufacturing sequence. The manufacturing sequence can include an Via formation, a metal routing level mask deposition, an etch process, the metal routing level deposition, and a polishing process to remove any overburden of the deposition.

Figure 4:
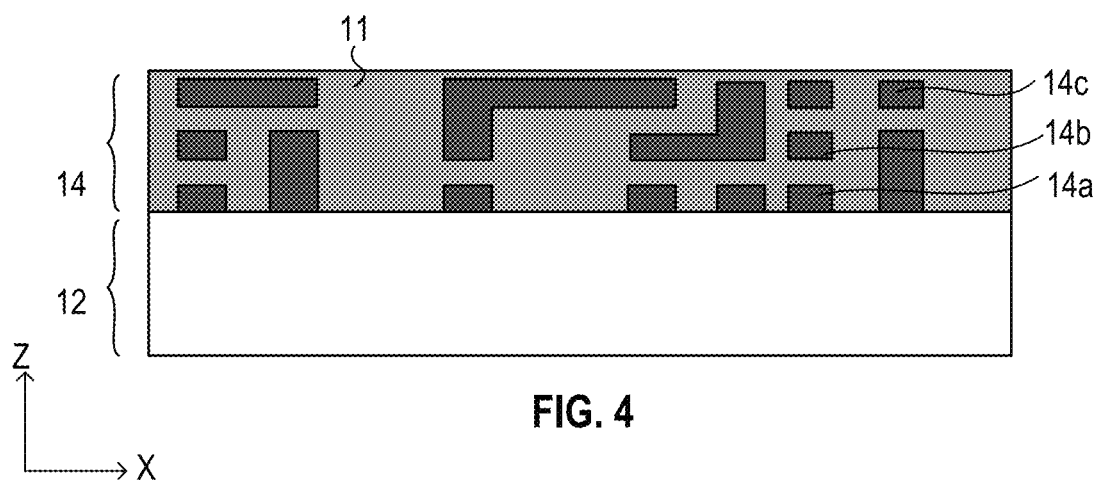

The manufacturing process sequence that includes the oxide deposition (e.g., deposition of the dielectric layer 11), the etching process, the Via formation, the metal routing level deposition, the polishing process can be repeated to from a plurality of additional metal routing levels. For example, three to six metal routing levels can be formed once the manufacturing process sequence is completed. FIG. 4 illustrates three metal routing levels (e.g., 14a-14c) as an example. Once the metal routing levels are completed, a first wiring layer 14 can be formed that is positioned over the layer of logic devices 12 and coupled to the underlying layer of logic devices 12.

Figure 5:
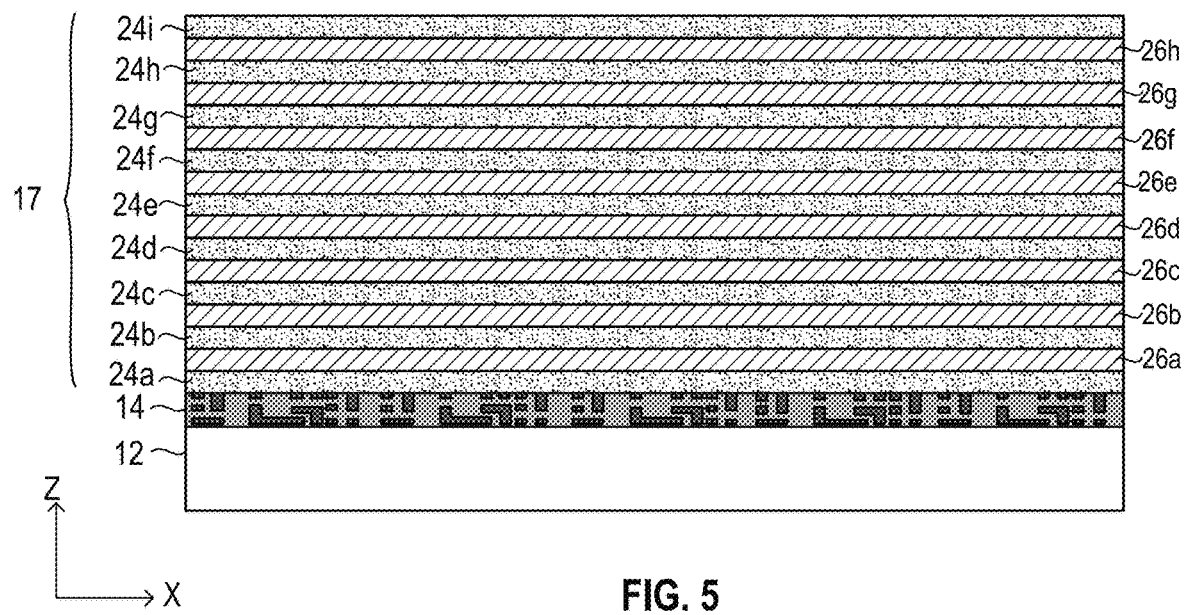
Figure 6:
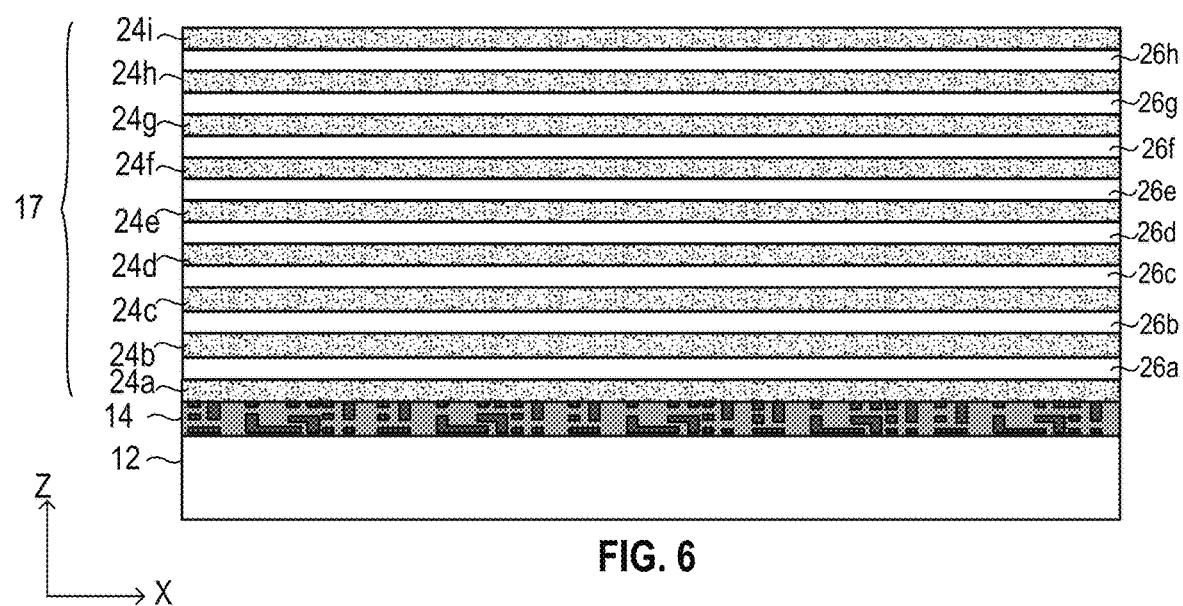

Next, a stack of layers is deposited on the first wiring layer 14. The stack of layers can be a memory stack 17 that includes alternating layers of a dielectric and a polysilicon. The dielectric layers can function as insulating layers and the polysilicon layers can function as wordline layers. The wordline layers can be doped in-situ during the formation of the wordline layers. The wordline layers can be doped with either a N+ type or a P+ type and doped to various degrees of dopant. An exemplary embodiment of the memory stack 17 can be shown in FIG. 5. A shown in FIG. 5, nine insulating layers 24a-24i and eight wordline layers 26a-26h can be illustrated. Alternatively, as shown in FIG. 6, the stack of layers (or memory stack) 17 can be formed with alternating layers of a dielectric and a metal, where the insulating layers 24 are made of a dielectric material and the wordline layers 26 are made of a metal. The metal can be tungsten, TaN, TiN, or other metals. It should be noted that FIG. 5 is merely an exemplary embodiment that shows 17 layers (8 layers of doped polysilicon) for ease in describing. For example, the deposition of alternating layers can be 128 or 256 layers tall or any number of layers. Many ways can be applied to form the wordline layers and the insulating layers. For example, by using advanced ALD (atomic layer deposition) tools, very precise and relatively thin layers made of a dielectric, a polysilicon, or a metal can be achieved.

Figure 7:
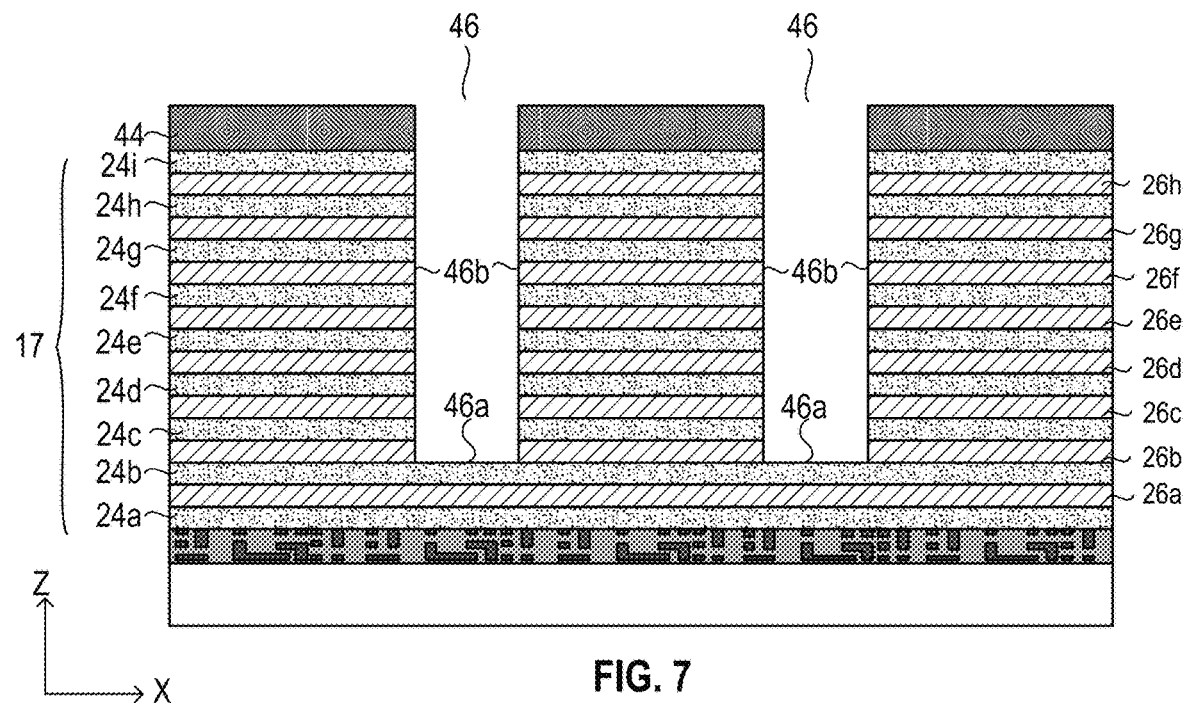
Figure 8:
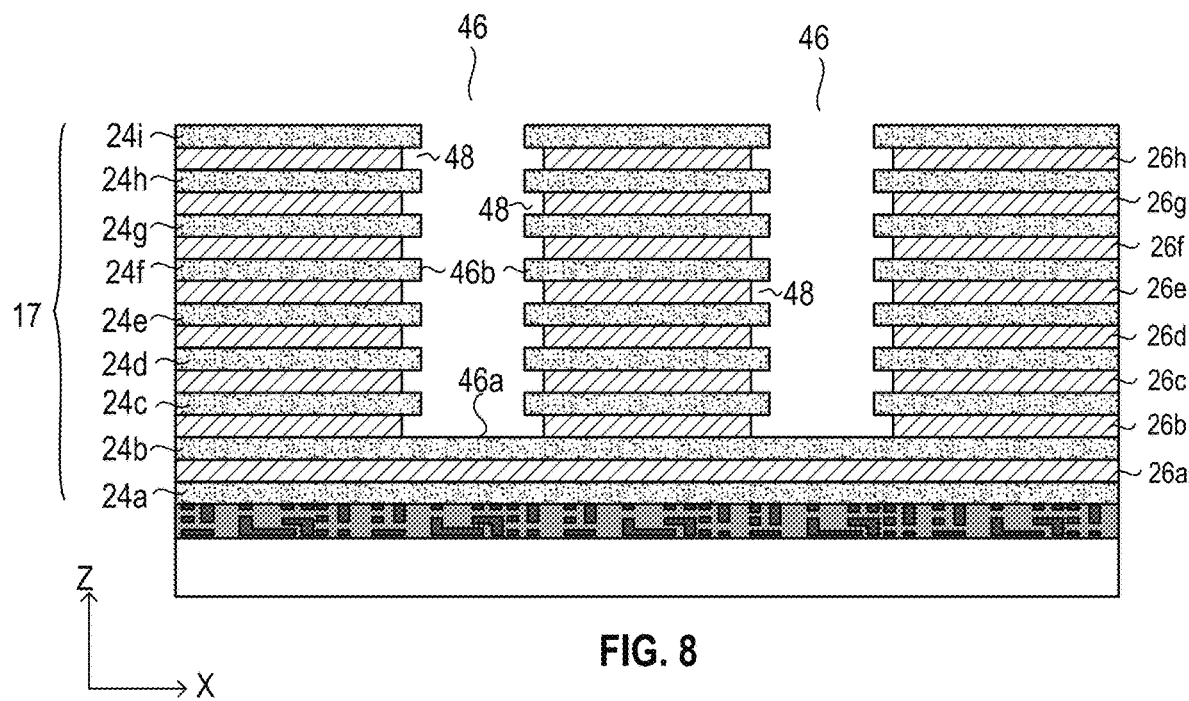

An etch mask 44 can be formed on the memory stack 17 and 3D NAND memory bit cell openings (or channel openings) 46 can be formed by an etching process to transfer the patterns of the etch mask 44 into the memory stack 17. An example result can be shown in FIG. 7 after the etching process. As shown in FIG. 7, the channel openings 46 can extend into a first portion of the memory stack 17 and stop on an insulating layer (e.g., the insulating layer 24b) of a second portion of the memory stack. The first portion of the memory stack 17 can include the wordline layers 26b-26h and the insulating layers 24c-24i. The second portion of the memory stack 17 can include the wordline layer 26a and the insulating layers 24a-24b. The channel openings 46 can have bottoms 46a and sidewalls 46b. Note that the bottom doped polysilicon layer (or bottom wordline layer) 26a can be kept (not etched) for a purpose as a conductor layer. Similarly, when the memory stack 17 illustrated in FIG. 6 is applied herein for forming the 3D NAND memory device, the bottom wordline layer 26a is a metal layer that can also be kept (untouched).

When the channel openings 46 are formed, the etch mask 44 can be removed, and portions of the polysilicon layers (e.g., the wordline layers) can be recessed from the sidewalls of the channel opening by a lateral or isotropic etch. A plurality of gaps can be formed in the recessed (or removed) polysilicon layers (or wordline layers). The gaps in the recessed polysilicon layers can be future locations of floating polysilicon gates, that is, bit cells. In an exemplary embodiments of FIG. 8, the portions of the wordline layers (e.g., 26b-26h) are removed so that the wordline layers 26b-26h are recessed from the sidewalls 46b of the channel openings 46, and the gaps 48 are formed between the insulating layers 24 and further positioned along the sidewalls 46b of the channel openings 46.

Figure 9:
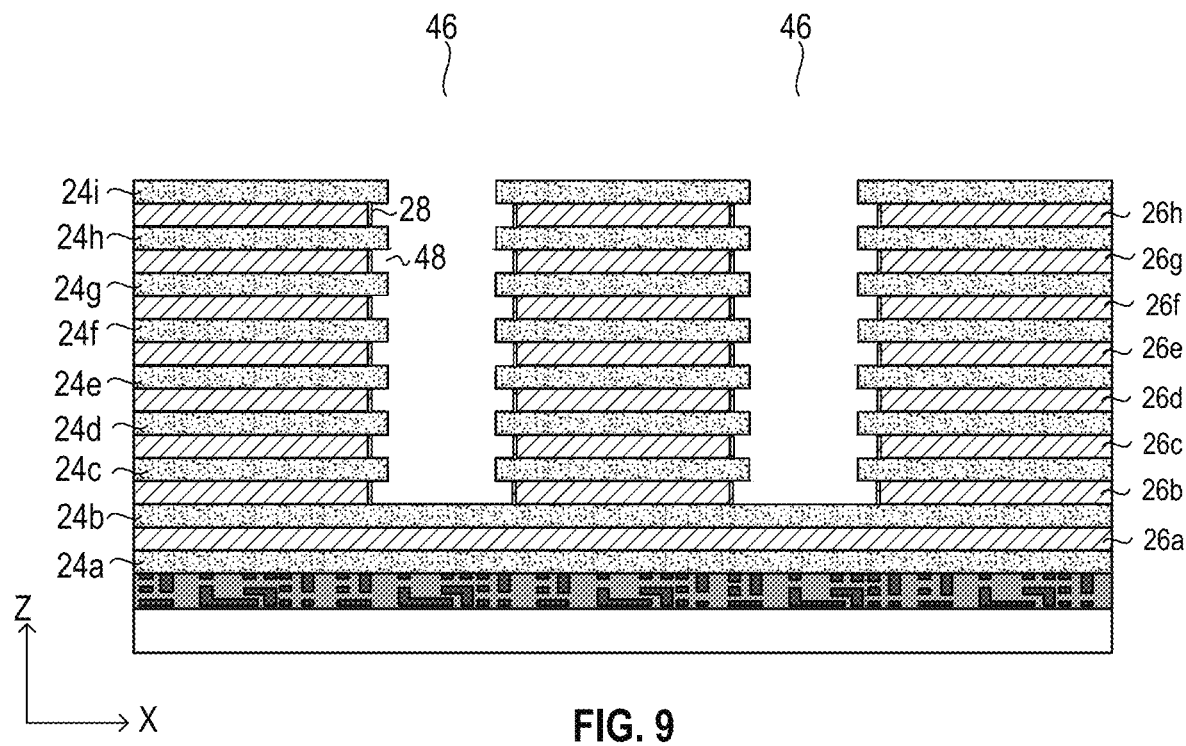

When the polysilicon layers (or wordline layers) 26b-26h are recessed, a conformal oxide deposition process can be executed that follows contours of recessed polysilicon layers 26. As shown in FIG. 9, the conformal oxide deposition process can form oxide layers 28 along sidewalls of the wordline layers 26b-26h. The oxide layers 28 can function as a poly edge electrode oxide (or blocking layers) 28 in the 3D NAND memory device. The conformal oxide deposition process can be a thermal oxidation process that oxidizes the sidewalls of the wordline layers 26b-26h to form the blocking layers 28 along the sidewalls of the wordline layers 26b-26h.

Figure 10:
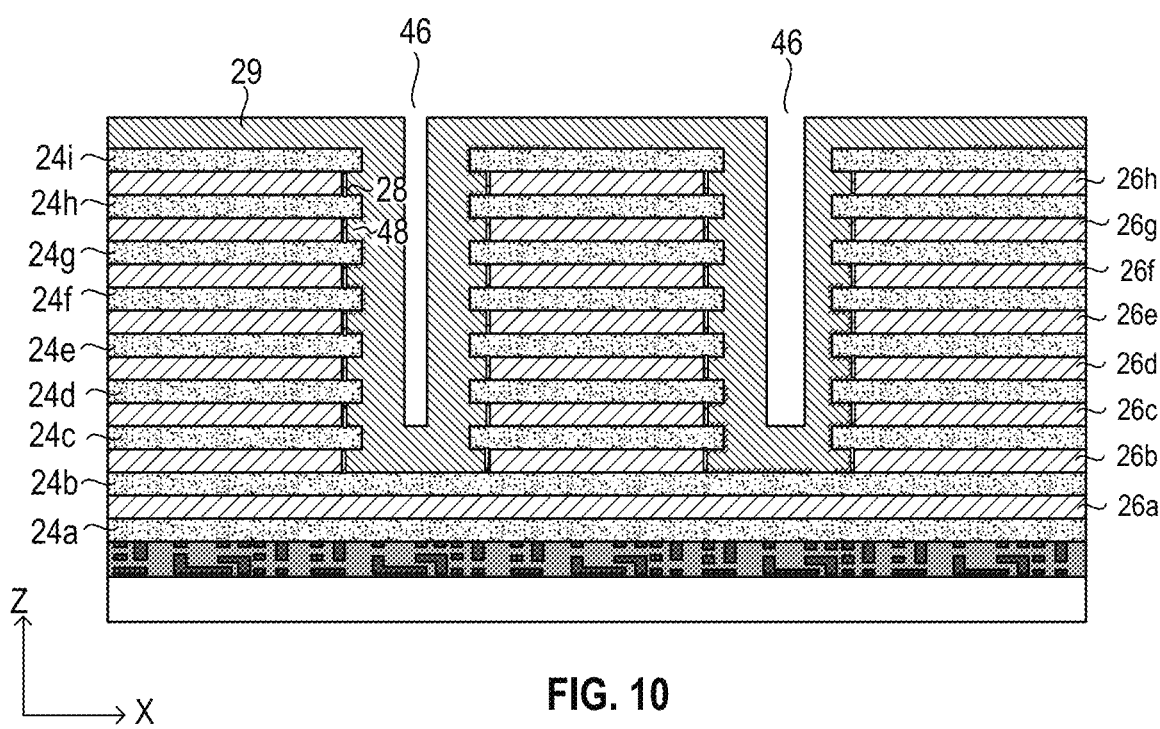

In FIG. 10, a polysilicon layer 29 can be deposited into the channel openings 46. The polysilicon layer 29 can be formed along the sidewalls and over the bottoms of the channel openings, and further conformally fill the gaps 48.

Figure 11:
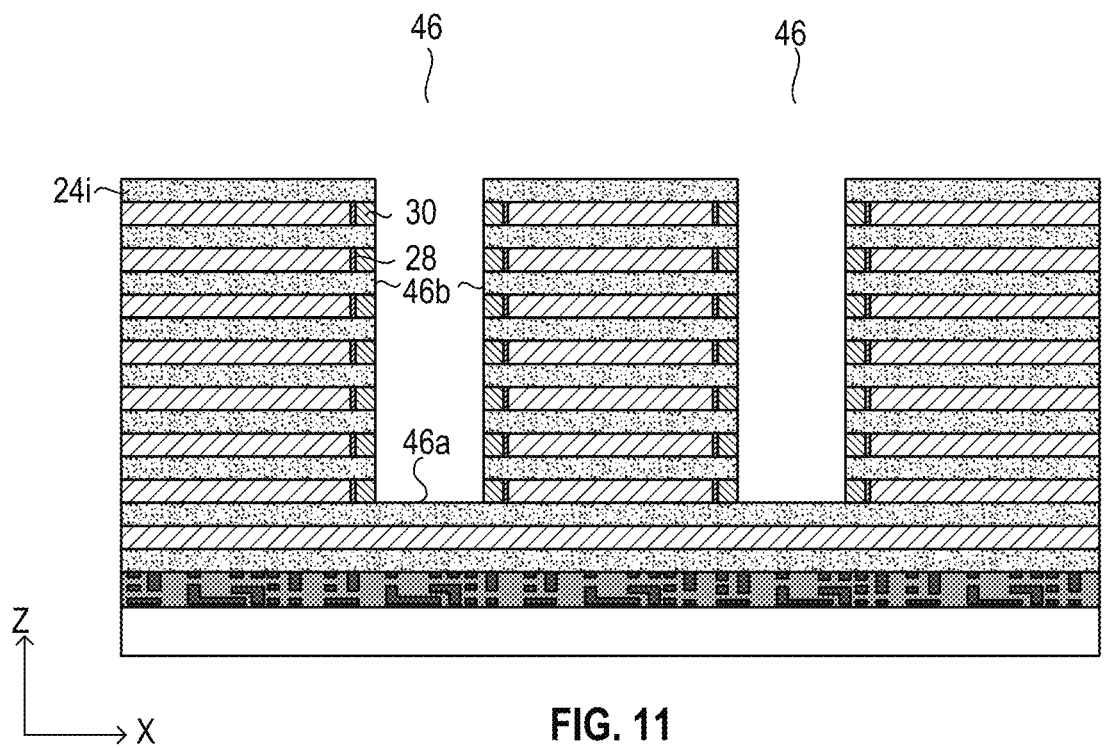
Figure 12:
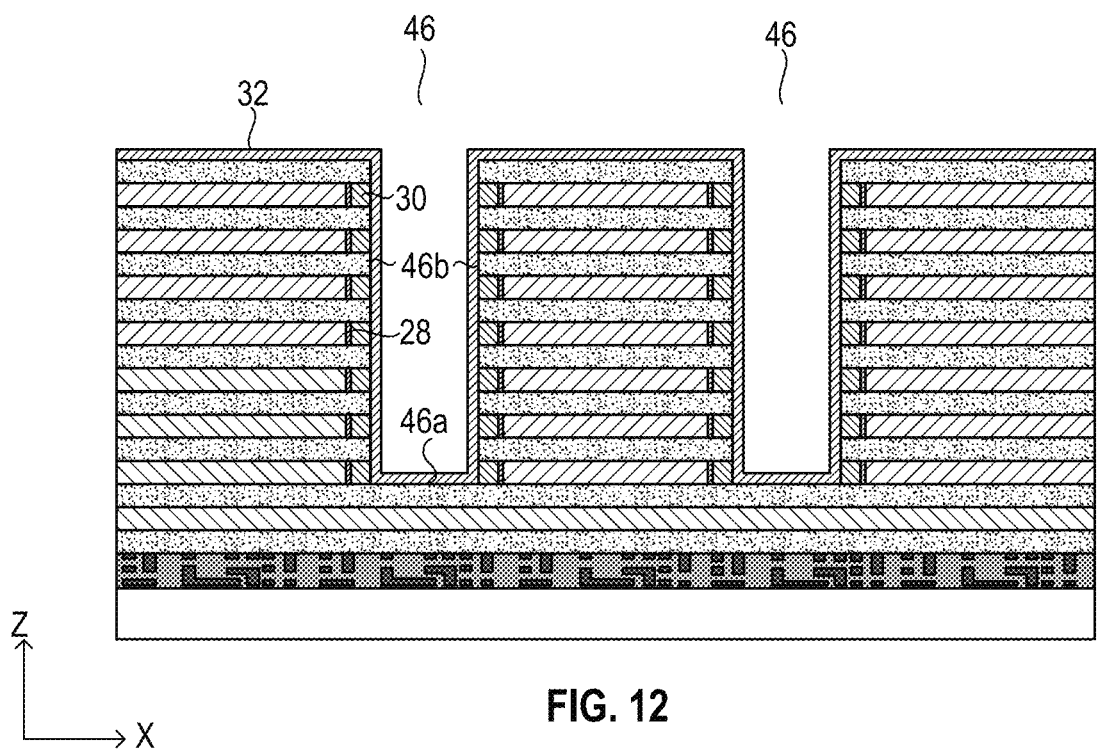

In FIG. 11, an etching process, such as an RIE (reactive ion etch) process, can be executed to remove a portion of the polysilicon layer 29 along the sidewalls 46b and over the bottom 46a of the channel openings 46. The etching process can further etch a portion of the polysilicon layer 29 over an uppermost insulating layer 24i. A portion of the polysilicon layers 29 that remains in the gaps 48 becomes charge storage layers 30 where future electrons can be either stored or erased for a 3D NAND memory cell after the fabrication process is complete.

Subsequently, a tunnel oxide (or tunneling layer) 32 can be formed in the channel openings 46. As shown in the FIG. 12, the tunneling layer 32 can be disposed along the sidewalls 46b and positioned over the bottoms 46a of the channel openings 46. The tunneling layer 32 can also be disposed on the uppermost insulating layer 24i.

Figure 13:
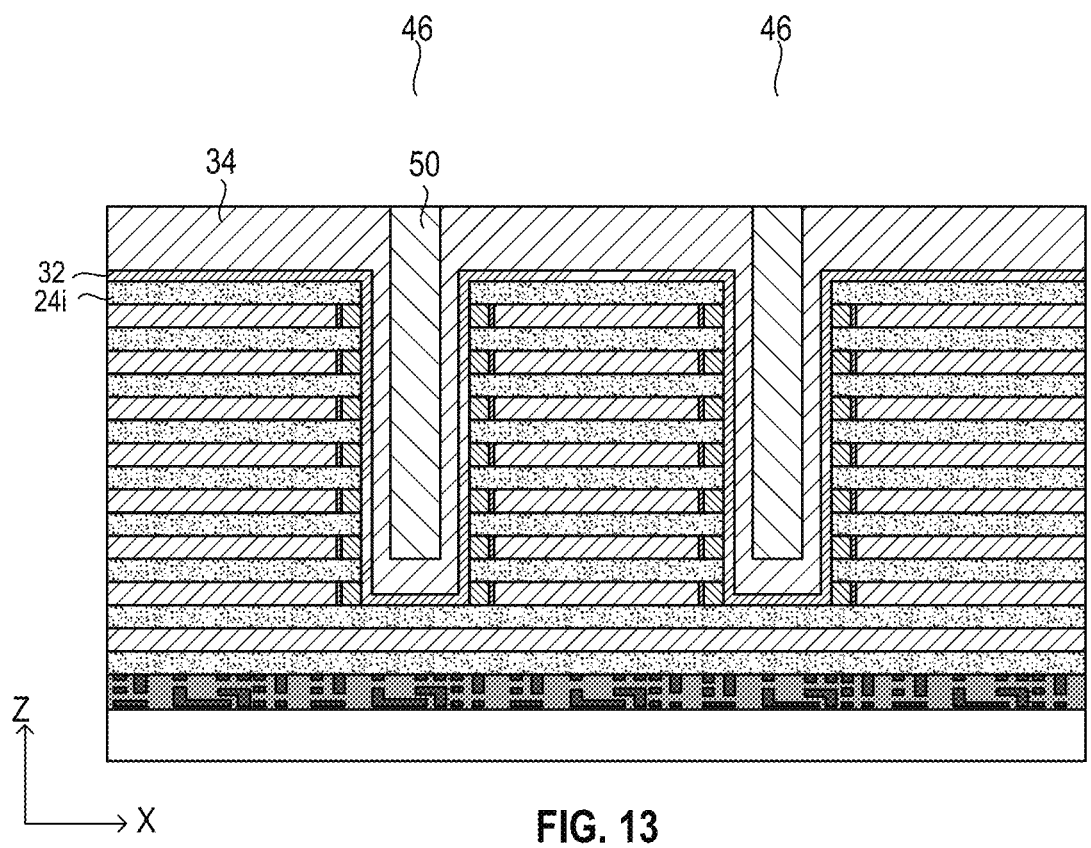

Next, a polysilicon layer (or channel layer) 34 can be deposited into the channel opening 46 conformally. The channel layer 34 can be positioned over the tunneling layer 32. As shown in FIG. 13, the channel layer 34 can be formed along sidewalls of the tunneling layer 32 and positioned on a bottom of the tunneling layer 32. The channel layer 34 can further be positioned over the uppermost insulating layer 24i. In some embodiments, the channel layer 34 fills the channel openings 46 incompletely and gaps remain in the channel layer 34. An oxide deposition can be performed to fill the gaps, and any overburden of the oxide over a top surface of the channel layer 34 can be removed through a polishing process, such as a chemical mechanical polishing (CMP) process. The oxide remains in the gaps becomes the dielectric layer 50. As shown in FIG. 13, the dielectric layers 50 can be positioned on the channel layer 34 and surround by the channel layer 34.

Figure 14:
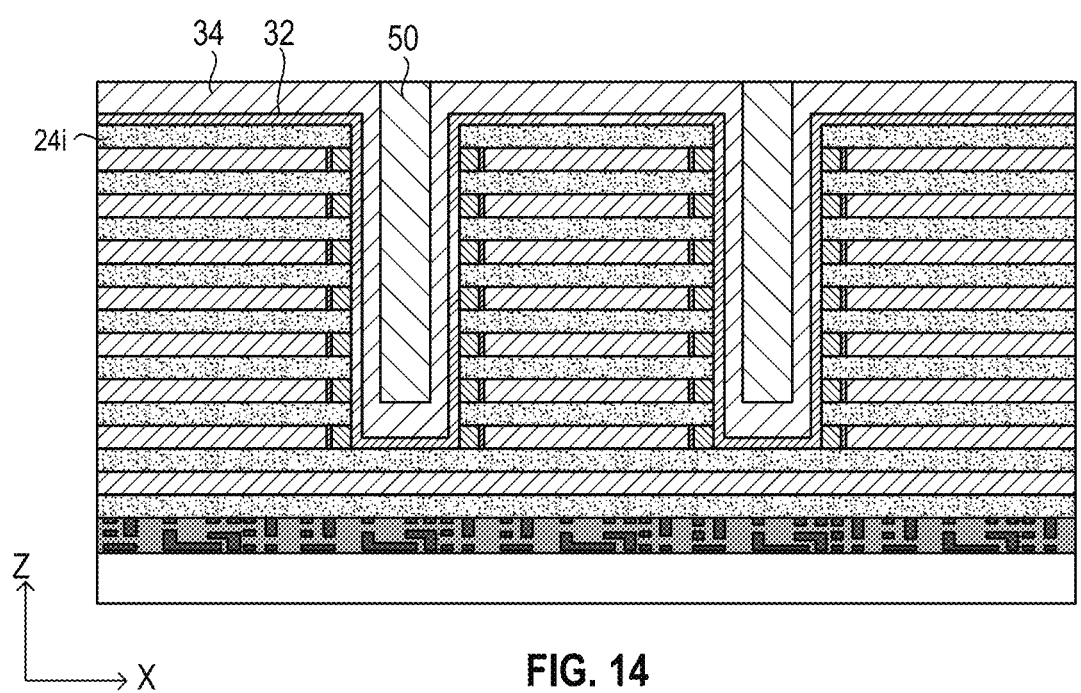

The polishing process can continue to remove portions of the channel layer 34 and the dielectric layers 50 to reduce a stack height. FIG. 14 illustrates an example result of the polishing process.

Figure 15:
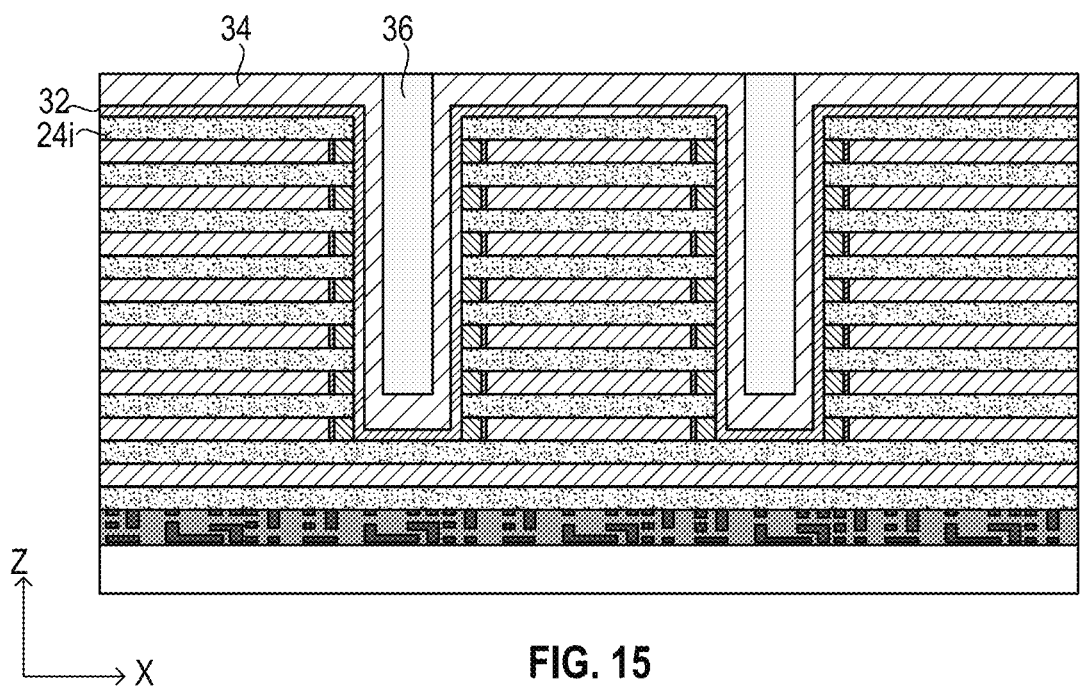

The dielectric layers 50 can then be removed and replaced with metal layers (or channel contacts) 36. The channel contacts 36 can be made of W, Co, Ru, Al, Cu or other suitable metallic materials. The channel contacts 36 can be deposited by any suitable deposition process, such as a CVD process, a PVD process, a sputter process, an ALD process, a plating process, or a combination thereof. Any overburden of the deposition can be removed by a polishing process afterwards. FIG. 15 shows a result when the polishing process is completed.

Figure 16:
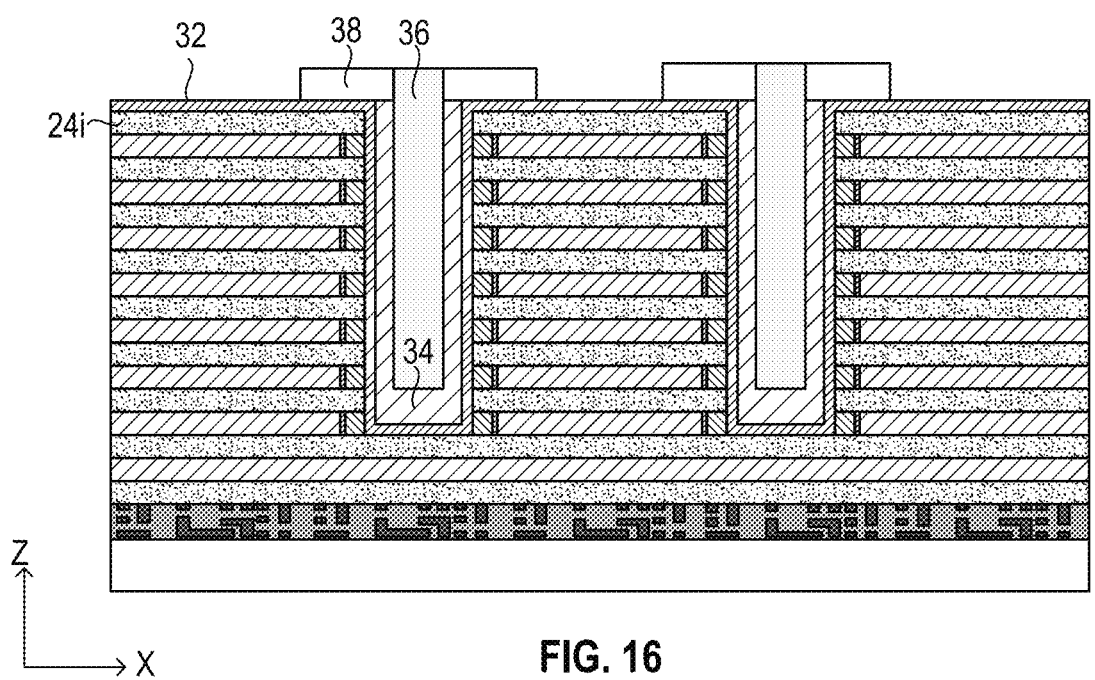

In FIG. 16, a trim process can be operated to remove portions of the channel layer 34 that are positioned over the tunneling layer 32 by an etching process, and portion of the channel layers 34 surrounding the channel contacts 36 remains. The remaining channel layer 34 that is positioned over the tunneling layer 32 and arranged to surround the channel contacts 36 can further be doped with a N+ dopant thought an implantation process. When the implantation process is completed, the remaining channel layer 34 that is positioned over the tunneling layer 32 and arranged to surround the channel contacts 36 becomes top channel contacts 38.

Figure 17:
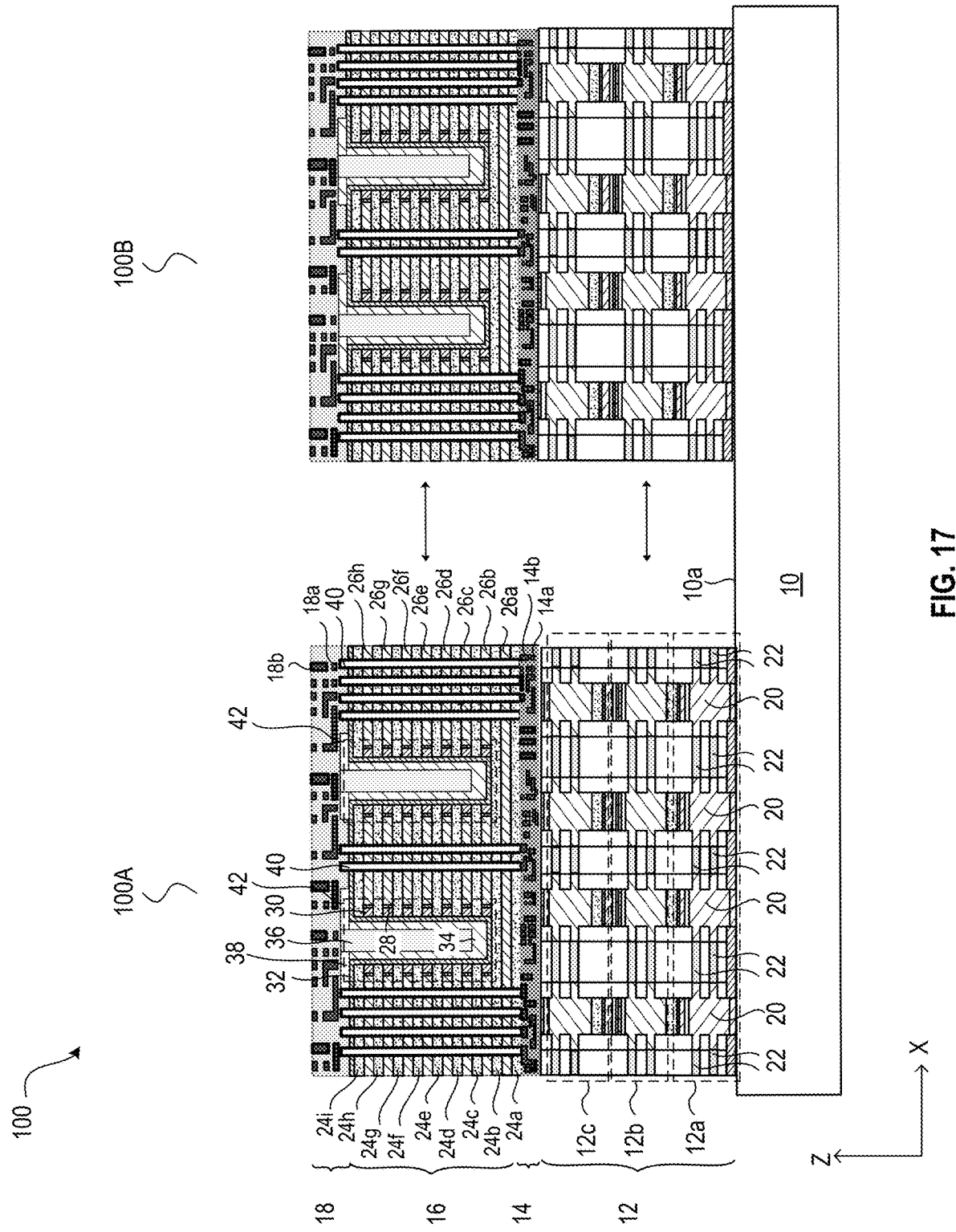

In FIG. 17, a wiring structure that includes a plurality of wordline contacts 40 can then be formed in the wordline layers 26 and the insulating layers 24. The wordline contacts 40 can extend through the wordline layers 26 and the insulating layers 24 so as to be coupled to the first wiring layer 14. When the wordline contacts 40 are formed, a complete 3D NAND memory device 16 can be disposed on the first wiring layer 14. Further, a second wiring layer 18 can be formed over the 3D NAND memory device 16. The second wiring layer 18 can be formed based on a similar manufacturing process that is applied to form the first wiring layer 14 and coupled to the wordline contacts 40. When the formation of the second wiring layer 18 is completed, a semiconductor device 100 can be formed. As shown FIG. 17, the semiconductor device 100 can have similar configurations to the semiconductor device 100 in FIG. 1. FIG. 17 illustrates a cross-sectional view of the semiconductor device 100 having a fabricated 3D NAND region (e.g., the 3D NAND memory device) 16 formed on top of a 3D logic region (e.g., a layer of logic devices) 12, where the 3D NAND region and the 3D logic region are all formed on a same substrate 10.

Figure 18:
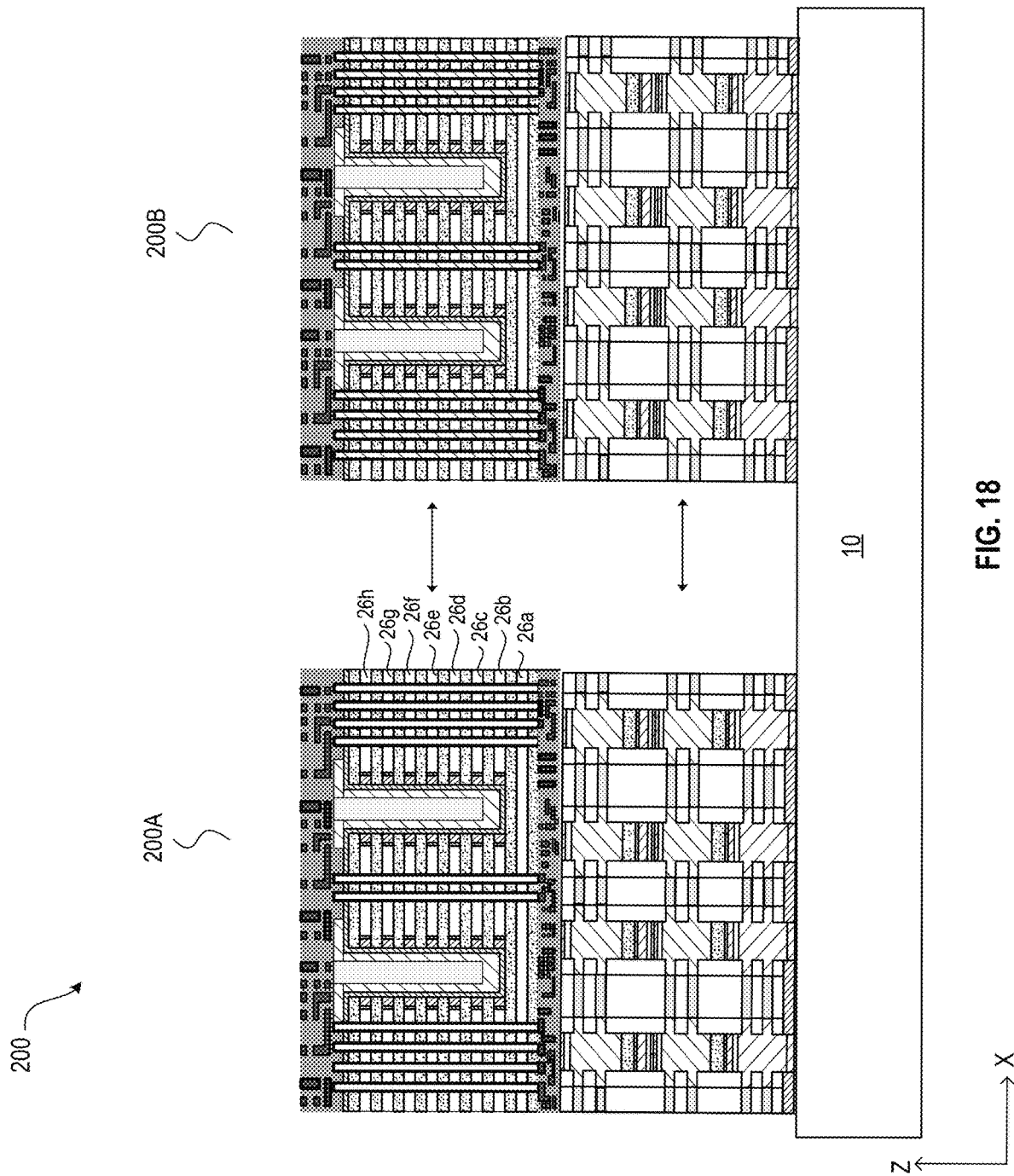
FIG. 18 is a cross-sectional view of another semiconductor device, in accordance with some embodiments.

FIG. 18 illustrates a semiconductor device 200. Comparing to the semiconductor device 100, the semiconductor device 200 can be formed based on the memory stack 17 that is illustrated in FIG. 6, where the wordline layers 26a-26h are made of a metal, such as W, TaN, or TiN.

FIGS. 19-28 provides another exemplary process flow to form a 3D NAND memory device based on a memory stack 300 having alternating wordline layers 302a-302h and insulating layers 306a-306h. The wordline layers 302 can be made of a metal, such as W, TaN, TiN or other suitable metallic materials. The insulating layers can be made of SiO, SiN or other suitable dielectric materials. The process flow starts with forming nanosheets, then wordlines, and then memory holes (or channel structures).

Figure 19:
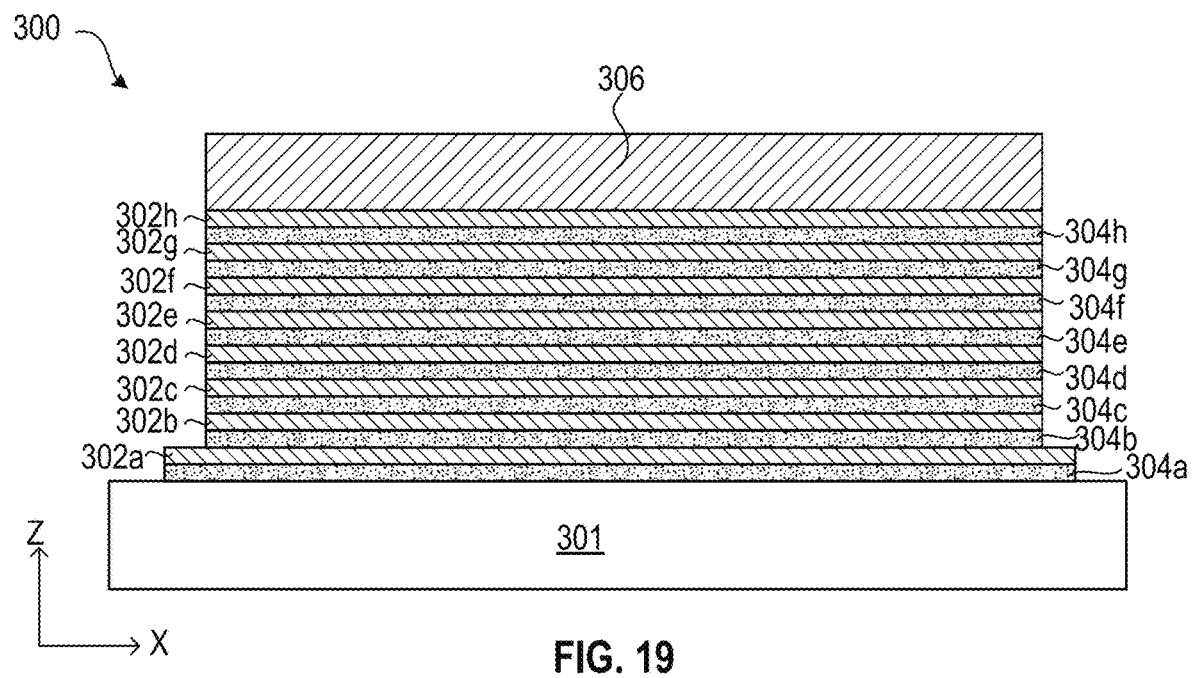
FIGS. 19-28 are cross-sectional views of second various exemplary intermediate steps of manufacturing a semiconductor device, in accordance with some embodiments.
Figure 20:
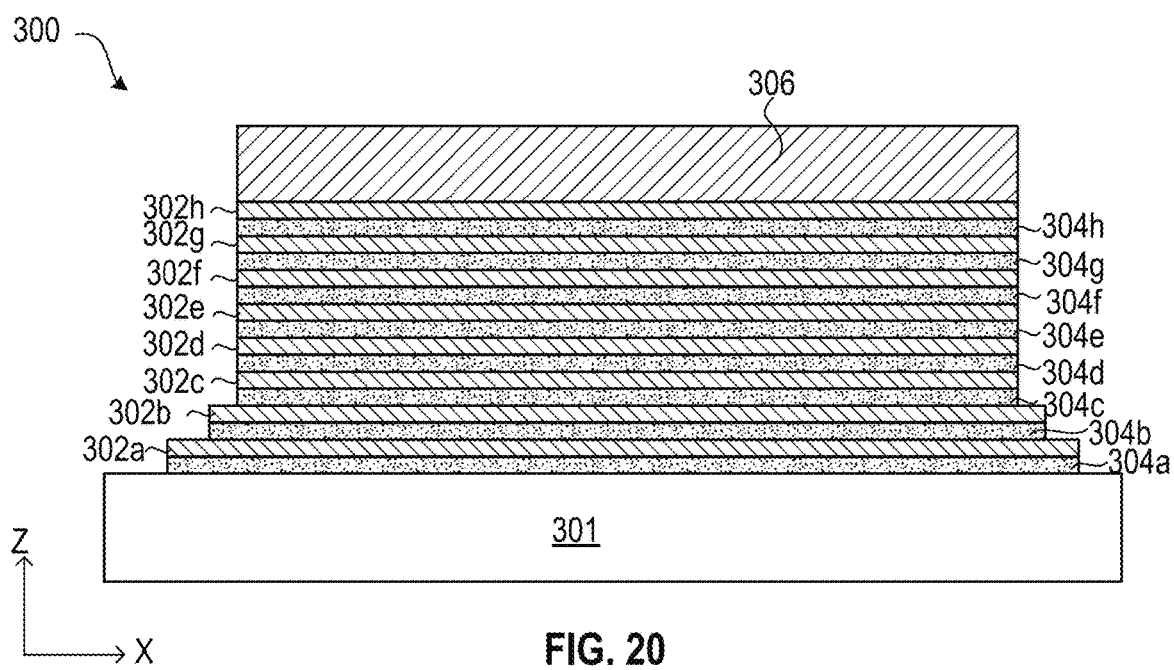

In FIG. 19, a trim-etch process for forming the wordlines is executed. Note that the formation of the wordlines can follow conventional 3D NAND processes. For example, in the trim-etch process, a photoresist etch mask 306 can be patterned over an uppermost wordline layer 302h, and then an etching process can etch the memory stack 300 along a vertical direction (e.g., Z direction) toward a substrate 301 to uncover a lowermost wordline layer 302a. In some embodiments, the substrate 301 can be the substrate 10 illustrated in FIG. 1. In some embodiments, the substrate 301 can be a wiring layer (e.g., the first wiring layer 14), and a 3D logic layer (e.g., the layer of logic devices 12) can be positioned under the wiring layer. In FIG. 20, the etch mask 306 is laterally trimmed and then the etch process is executed again to uncover a second-from-bottom wordline layer 302b. Note that just one photoresist mask (e.g., etch mask 306) can be used to uncover all wordline layers 302 following the sequence of trim and etch process.

Figure 21:
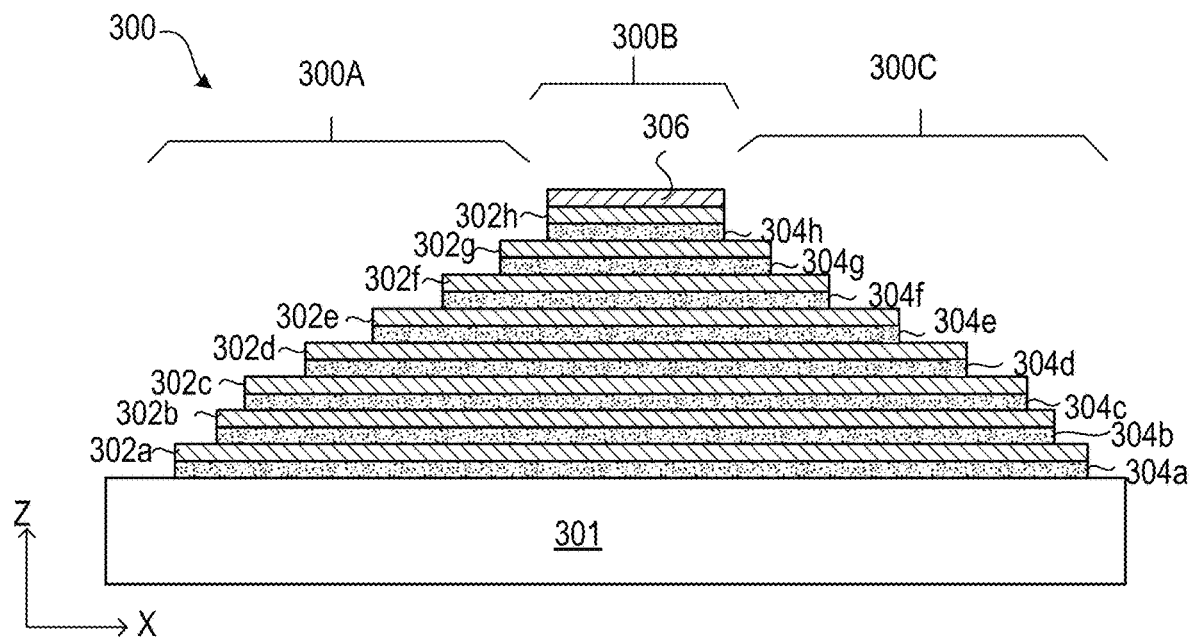

The stair etching technique (e.g., the trim-etch process) is repeated until reaching the uppermost wordline layer 302h, as shown in FIG. 21. When the trim-etch process is completed to reach the uppermost wordline layer 302h, staircase regions 300A and 300C, and an array region 300B can be formed in the memory stack 300. As shown in FIG. 21, the array region 300B is disposed between the staircase regions 300A and 300B. In the staircase regions 300A and 300C, the wordline layers 302 are arranged in a staircase configuration and function as wordlines of the 3D NAND memory device. In the array region 300B, the wordline layers 302 can function as gate electrodes (or control gates) of the 3D NAND memory device. In FIG. 21, eight wordline layers 302 and eight insulating layers 304 are provided that are arranged alternatingly over the substrate 301. However, it should be noted that FIG. 21 is merely an example, and any number of wordline layers and any number of insulating layers can be included in the memory stack 300 according to the structure of the 3D NAND memory device.

Figure 22:
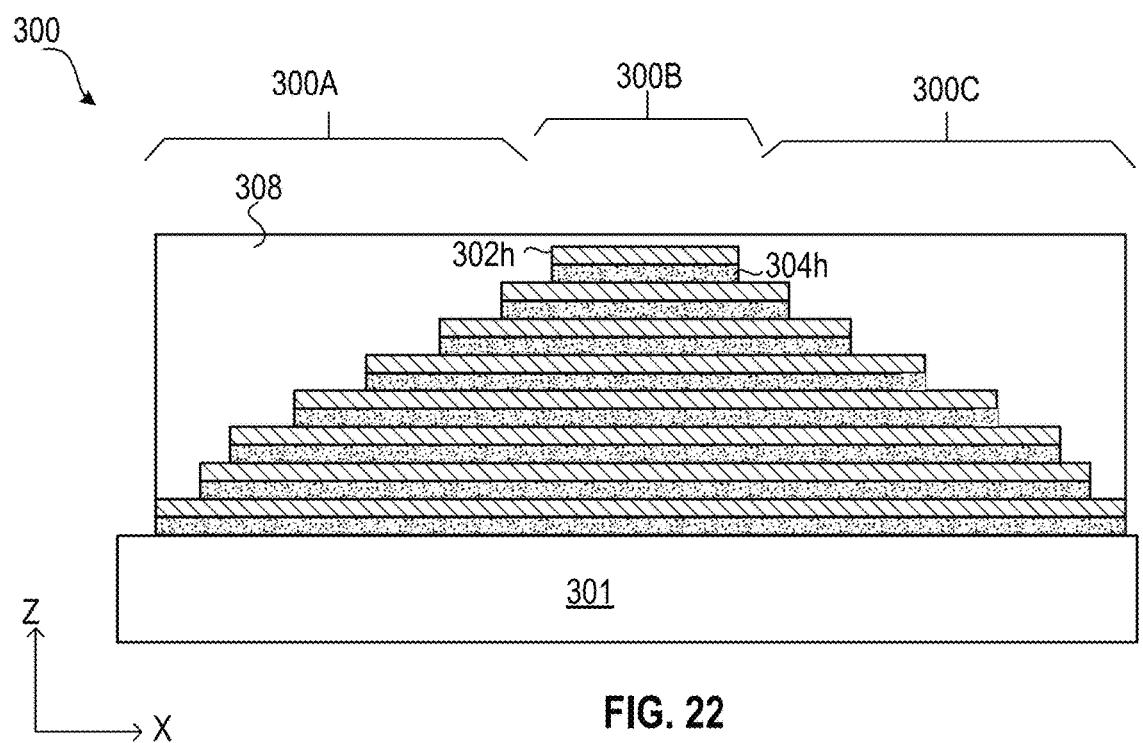

When the wordline layers 302 are formed in the staircase regions 300A and 300C, remaining photoresist etch mask 306 can be removed. Then an oxide deposition step can be applied to fill the substrate 301 up to the uppermost wordline layer 302h at least. Oxide overburden can be polished subsequently. FIG. 22 shows an example result of the oxide deposition and the oxide overburden polishing. When the oxide overburden is removed, a dielectric layer 308 can be formed, where the dielectric layer 308 covers the staircase regions 300A and 300C. The dielectric layer 308 can further cover the array region 300B.

Figure 23:
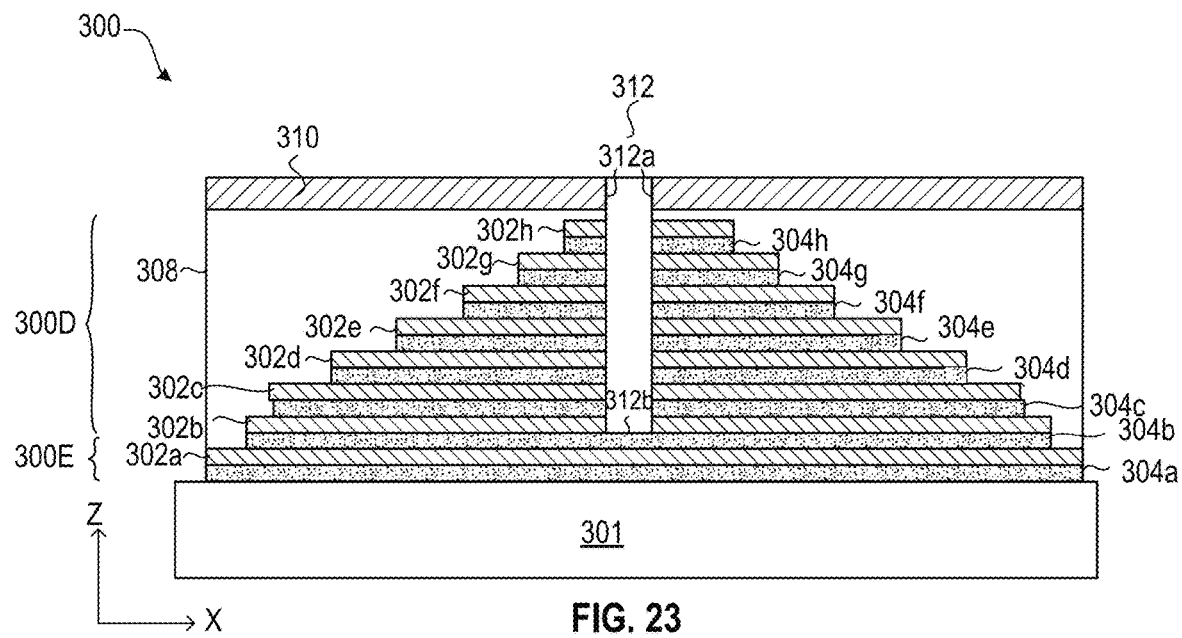

In FIG. 23, an etch mask 310 can be formed to define a 3D memory bit etch down to the memory stack 300 so that the 3D memory bit etch can form channel openings. The channel openings can extend into a first portion the memory stack 300 and can be positioned on a second portion of the memory stack 300. For simplicity and clarity, a channel opening 312 can be illustrated in FIG. 23. In an exemplary embodiment of FIG. 23, the channel opening 312 can extend into the first portion 300D of the memory stack 300 that includes the wordline layers 302b-302h and the insulating layers 304c-304h, and can be positioned on the second portion 300E of the memory stack 300 that include the wordline layer 302a and the insulating layers 304a-304b. The channel opening 312 can have sidewalls 312a and a bottom 312b that uncover the insulating layer 304b. In some embodiments, in order to form the channel opening 312, a self-aligned double/multi-patterning technique can be used to define a minimum opening.

Figure 24:
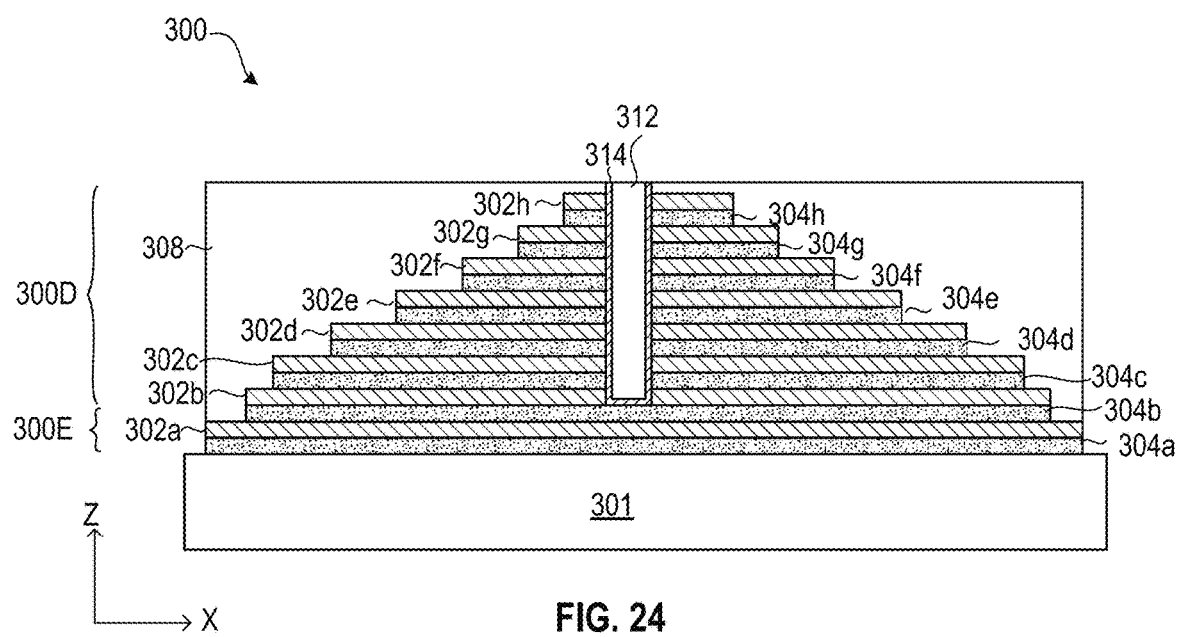

The etch mask 310 can be removed and a charge trap layer 314 can be grown along sidewalls of the channel opening 312 and further positioned on insulating layer 304b of the second portion 300E of the memory stack 300. In some embodiments, the charge trap layer 314 can include first oxide/nitride/second oxide (or first dielectric/charge storage layer/first dielectric). The first oxide can function as a blocking layer positioned along the sidewalls of the channel opening 312 and on the second portion 300E of the memory stack 300, the nitride can function as a charge storage layer positioned over the blocking layer, and the second oxide can function as a tunneling layer positioned over the charge storage layer. However, many different charge storage combinations are available in the present disclosure. FIG. 24 illustrates an example result of forming the charge trap layer 314 that covers the bottom and the sidewalls of the channel opening 312.

Figure 25:
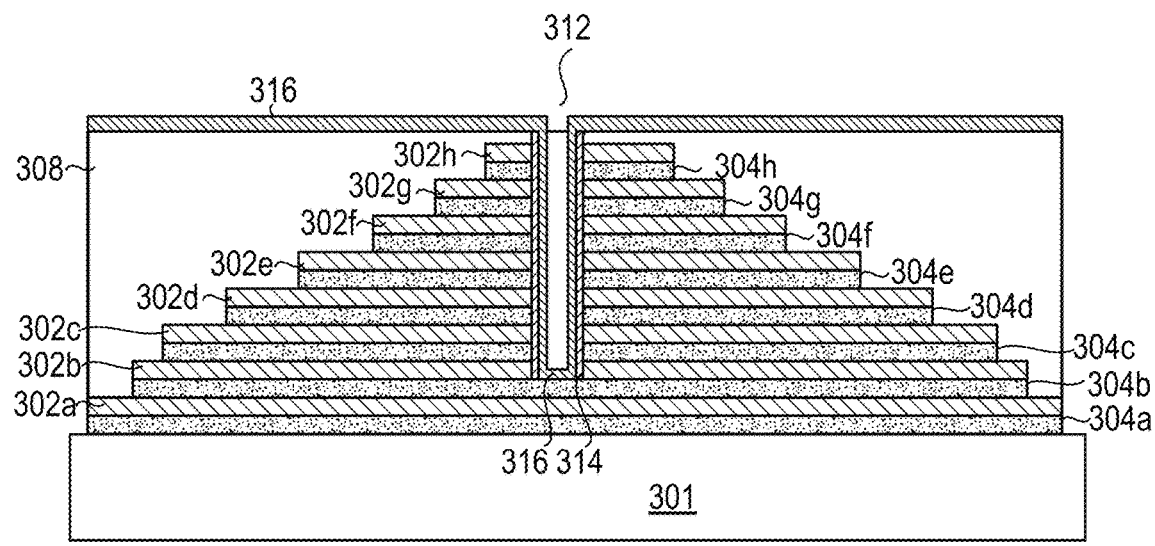

In FIG. 25, an etch process can subsequently be applied to remove the charge trap layer 314 at the bottom of the channel opening 312, thereby uncover the insulation layer 304b. An epitaxial growth process can be used to form a channel layer 316 over the charge trap layer 314. The channel layer 316 is positioned along sidewalls of the channel opening 312 and further on the insulating layer 304b. A portion of the channel layer 316 positioned on the insulating layer 304b can have a N+ doping, a portion of the channel layer 316 positioned along the sidewalls of the channel openings 312 can be lightly doped or intrinsic, and a portion of the channel layer 316 positioned over the dielectric layer 308 can have a N+ doping as well. In some embodiments, the epitaxial growth process can be well controlled so that the channel layer 316 fills the channel opening 312 incompletely, and gaps still remains in the channel opening 312 after the formation of the channel layer 316.

Figure 26:
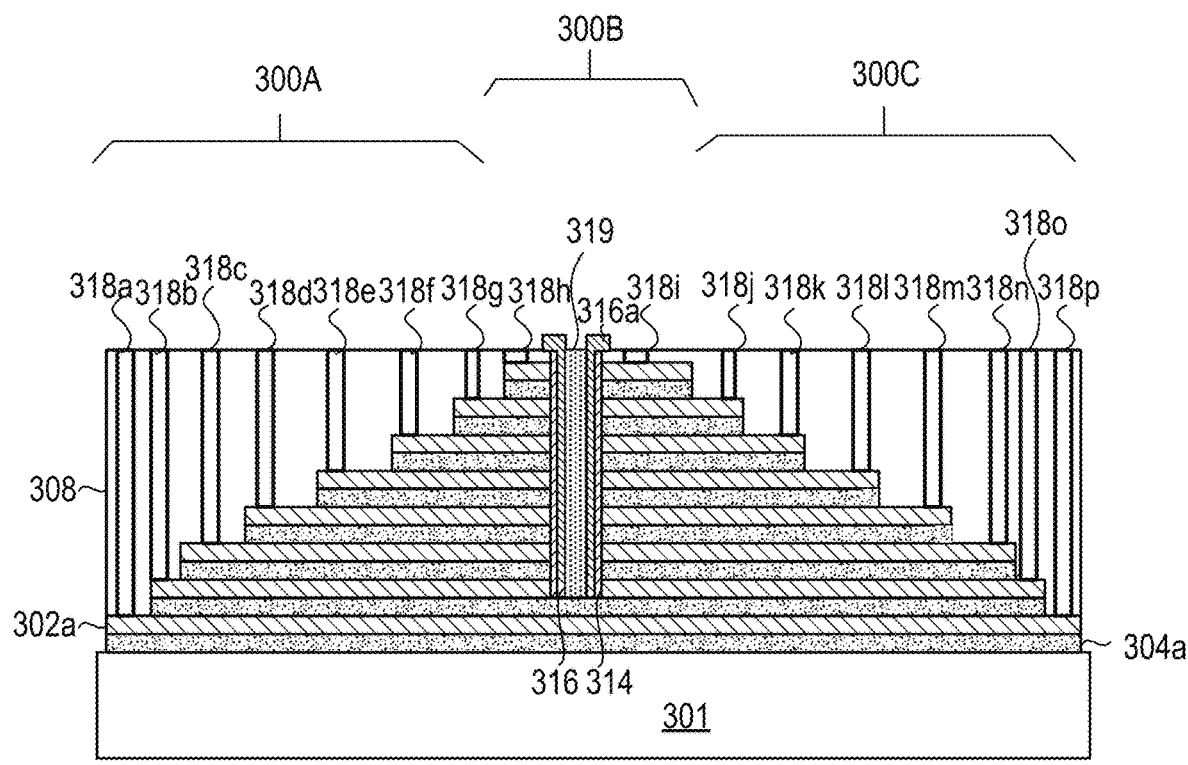

In FIG. 26, a dielectric layer, such as an oxide layer 319, can be filled in the channel opening. In addition, the channel layer 316 can be trimmed for a bitline deposition in subsequent steps. In order to trim the channel layer 316, a photoresist mask can be applied and an etch process can be applied to remove a first portion of the channel layer 316 that is not covered by the photoresist mask and a second portion 316a of the channel layer 316 that is covered by the photoresist mask remains. As shown in FIG. 26, the second portion 316a of the channel layer 316 can be positioned over the dielectric layer 308 and further be disposed to surround the oxide layer 319.

In some embodiments, before the formation of the oxide layer 319, the portion of the channel layer 316 on the insulating layer 304b can be removed so as to uncover the insulating layer 304b. Accordingly, the oxide layer 319 can be positioned on the insulating layer 304b, which is shown in FIG. 26. In some embodiments, prior to the trim process, another layer of polysilicon can be deposited on the channel layer 316 to increase a thickness of the channel layer 316 on the dielectric layer 308, and then the trim process can be operated subsequently. In an embodiment, the channel layer 316 can be trimmed at first and then the oxide layer 319 can be filled in the channel opening. In some embodiments, the second portion 316a of the channel layer 316 can function as a top channel contact 316a to be coupled to bitline structures. In some embodiments, the top channel contact 316a can be doped with N+ dopants.

Still referring to FIG. 26, another mask (not shown) can be used for wordline (also referred to control gate (CG)) etching to form a plurality of Via openings 318a-318p. The Via openings 318 can extend through the dielectric layer 308 and land on the wordline layers 302 in the staircase regions 300A and 300C so that the wordlines layers 302 can be uncovered by the Vias openings 318.

Figure 27:
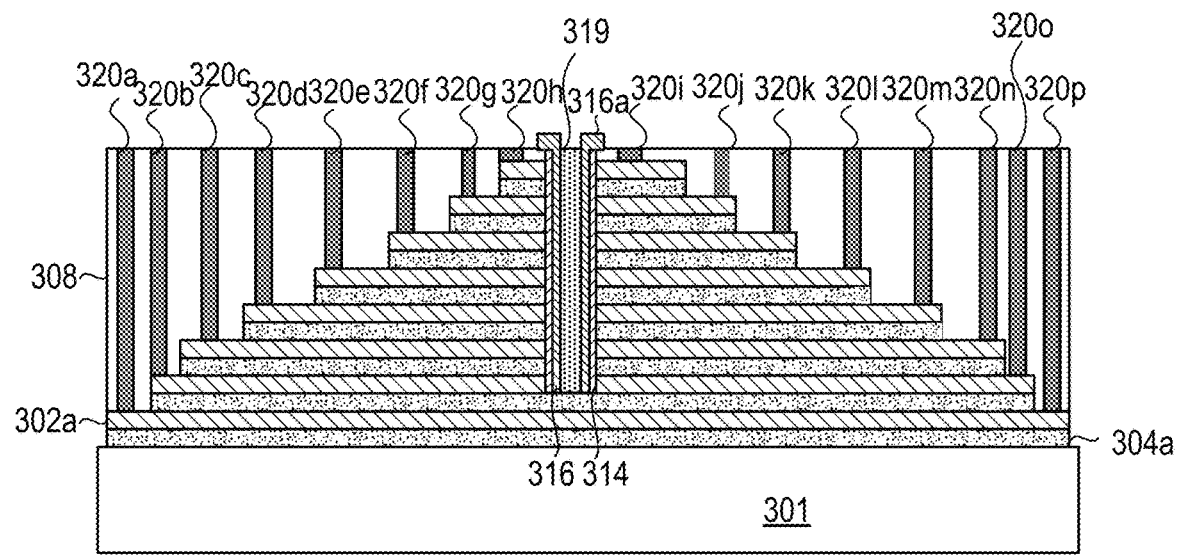

In FIG. 27, the Via openings 318 can further be filled with a conductive material, such as W, Co, Ru, Al, or Cu. A surface planarization can be applied to remove excess conductive material over the dielectric layer 308. The conductive material that remains in the Via openings 318 becomes wordline contacts 320a-320p in the staircase regions 300A and 300C. As shown in FIG. 27, the wordline contacts 320 are positioned on the wordline layers 302 to connect to the wordline layers 302 in the staircase regions 300A and 300C.

Figure 28:
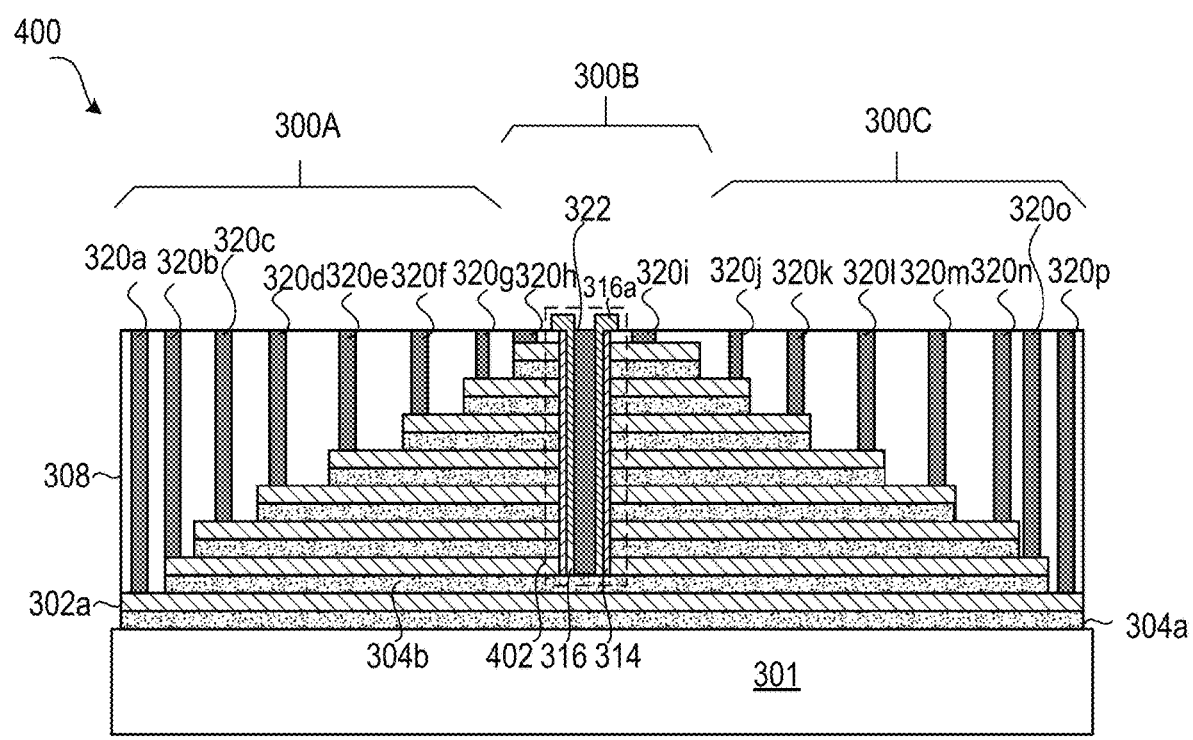

In FIG. 28, the oxide layer 319 can be removed and filled with a conductive material, such as W, Co, Ru, Al, or Cu. Any overburden of the conductive material over the dielectric layer 308 can be removed and conductive material remains in the channel openings becomes the channel contact 322. When the channel contact 322 is formed, a 3D NAND memory device 400 can be formed. As shown in FIG. 28, the 3D NAND memory device 400 has wordline layers 302 and the insulating layers 304 that are stacked alternatingly over the substrate 301. In some embodiments, the substrate 301 can be a wiring layer (e.g., the first wiring layer 14) that is positioned on a layer of logic devices (e.g., the layer of logic devices 12). The 3D NAND memory device 400 has at least one channel structure 402. The at least one channel structure 402 can have a charge trap layer 314 that extends into the wordline layers 302 and the insulating layers 304, and further is positioned on an insulating layer (e.g., the insulating layer 304b). The charge trap layer 314 can include a blocking layer, a charge storage layer, and a tunneling layer. The at least one channel structure 402 can also have a channel layer 316 that is formed along sidewalls of the charge trap layer 314 and positioned on the insulating layer 304b, and a channel contact 322 that is disposed along sidewalls of the channel layer 316 and positioned on the insulating layer 304b. A plurality of wordline contacts 320 can be formed in the dielectric layer 308 and further positioned on the wordline layers 302.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of forming a semiconductor device, the method comprising:
    forming a layer of logic devices on a substrate, the layer of logic devices including a stack of gate-all-around field-effect transistors (GAA-FETs) positioned over the substrate, the stack of GAA-FETs including a first layer of GAA-FETs stacked over a second layer of GAA-FETs;
    forming a first wiring layer over the layer of logic devices, the first wiring layer including one or more metal routing levels;
    forming a memory stack including wordline layers and insulating layers that are alternatingly arranged over the first wiring layer; and
    forming a three-dimensional (3D) NAND memory device in the memory stack, the 3D NAND memory device including a channel structure that extends into the wordline layers and the insulating layers of the memory stack and further coupled to the wordline layers.

2. The method of claim 1, further comprising:
    forming a second wiring layer over the 3D NAND memory device, the second wiring layer including one or more metal routing levels.

3. The method of claim 2, wherein the forming the 3D NAND memory device further comprising:
    forming a channel opening extending into a first portion of the memory stack, the channel opening having sidewalls and a bottom that expose one of the insulating layers in a second portion of the memory stack, the first portion of the memory stack being positioned on the second portion of the memory stack;
    removing portions of the wordline layers in the first portion of the memory stack so that the wordline layers in the first portion of the memory stack are recessed from the sidewalls of the channel opening, and gaps are formed between the insulating layers in the first portion of the memory stack and further positioned along the sidewalls of the channel opening;
    forming blocking layers of the channel structure in the gaps, the blocking layers being disposed along sidewalls of the wordline layers in the first portion of the memory stack;
    forming charge storage layers of the channel structure along sidewalls of the blocking layers in the gaps so that the blocking layers are disposed between the wordline layers and the charge storage layers;
    forming a tunneling layer of the channel structure in the channel opening, the tunneling layer being positioned along the sidewalls and over the bottom of the channel opening;
    forming a channel layer of the channel structure over the tunneling layer in the channel opening; and
    forming a channel contact of the channel structure over the channel layer in the channel opening, the channel contact being surrounded by the channel layer.

4. The method of claim 3, wherein the forming the charge storage layers of the channel structure further comprises:
    forming a polycrystalline silicon layer along the sidewalls and over the bottom of the channel opening, the polycrystalline silicon layer further extending into the gaps to fill the gaps; and
    removing a first portion of the polycrystalline silicon layer along the sidewalls and the over the bottom of the channel opening so that a second portion of the polycrystalline silicon layer remains in the gaps, the second portion of the polycrystalline silicon layer that remains in the gaps becoming the charge storage layers of the channel structure.

5. The method of claim 4, wherein the forming the 3D NAND memory device further comprises:
    forming a top channel contact over an uppermost insulating layer of the insulating layers, the top channel contact being arranged to surround the channel contact and connected to the channel layer.

6. The method of claim 5, wherein the forming the 3D NAND memory device further comprises:
    forming wordline contacts in the wordline layers and the insulating layers, the wordline contacts extending through the wordline layers and the insulating layers so as to be coupled to the first wiring layer and the second wiring layer.

7. The method of claim 6, wherein the insulating layers are made of SiO.

8. The method of claim 6, wherein the wordline layers are made of polycrystalline Si.

9. The method of claim 6, wherein the wordline layers comprise at least one of tungsten (W), TaN, or TiN.

10. The method of claim 6, wherein the forming the layer of logic devices on the substrate further comprises:

forming the second layer of GAA-FETs over the substrate, the second layer of GAA-FETs including second GAA-FETs, source/drain regions and channel regions of the second GAA-FETs being disposed alternatingly and arranged along a top surface of the substrate; and forming the first layer of GAA-FETs over the second layer of GAA-FETs, the first layer of GAA-FETs having first GAA-FETs, source/drain regions and channel regions of the first GAA-FETs being disposed alternatingly and positioned along the top surface of the substrate.

11. The method of claim 2, wherein the forming the 3D NAND memory device further comprising:

performing an etching process to form staircase regions and an array region in the memory stack, the array region being positioned between the staircase regions;

forming a channel structure in the array region of the memory stack, the channel structure extending into the memory stack along a vertical direction of the substrate that is perpendicular to the substrate; and forming wordline contacts in the staircase regions, the wordline contacts landing on the wordline layers in the memory stack, and further extending along the vertical direction of the substrate.

12. The method of claim 11, wherein forming the channel structure further comprises:

forming a channel opening extending into a first portion of the memory stack along the vertical direction of the substrate, the channel opening having sidewalls and a bottom that uncovers one of the insulating layers in a second portion of the memory stack, the first portion of the memory stack being positioned on the second portion of the memory stack;

forming a blocking layer along the sidewalls and over the bottom of the channel opening;

forming a charge storage layer over the blocking layer in the channel opening;

forming a tunneling layer over the charge storage layer in the channel opening;

forming a channel layer over the tunneling layer in the channel opening;

performing an etching process to remove a portion of the blocking layer, a portion of the charge storage layer, a portion of the tunneling layer and a portion of the channel layer that are positioned over the bottom of the channel opening; and forming a channel contact in the channel opening, the channel contact being surrounded by the channel layer and arranged over the bottom of the channel opening.

* * * * *